(12) United States Patent
Kariya et al.

(10) Patent No.: US 8,395,054 B2
(45) Date of Patent: Mar. 12, 2013

(54) SUBSTRATE FOR MOUNTING SEMICONDUCTOR ELEMENT AND METHOD FOR MANUFACTURING SUBSTRATE FOR MOUNTING SEMICONDUCTOR ELEMENT

(75) Inventors: Takashi Kariya, Ogaki (JP); Daiki Komatsu, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 263 days.

(21) Appl. No.: 12/616,891

(22) Filed: Nov. 12, 2009

(65) Prior Publication Data

US 2010/0230148 A1    Sep. 16, 2010

Related U.S. Application Data

(60) Provisional application No. 61/159,660, filed on Mar. 12, 2009.

(51) Int. Cl.
*H05K 1/16* (2006.01)
(52) U.S. Cl. .......................................... 174/260; 174/262
(58) Field of Classification Search ......................... None
See application file for complete search history.

(56) References Cited

U.S. PATENT DOCUMENTS

| | | | |
|---|---|---|---|
| 6,029,343 A * | 2/2000 | Wieloch | 29/830 |
| 6,324,067 B1 * | 11/2001 | Nishiyama | 361/761 |
| 7,091,589 B2 * | 8/2006 | Mori et al. | 257/686 |
| 2008/0093118 A1 * | 4/2008 | Takahashi et al. | 174/264 |
| 2008/0277150 A1 * | 11/2008 | Takashima et al. | 174/260 |
| 2009/0255716 A1 | 10/2009 | Kariya et al. | |
| 2009/0260857 A1 | 10/2009 | Kariya et al. | |

FOREIGN PATENT DOCUMENTS

JP    2004-281830    10/2004

OTHER PUBLICATIONS

U.S. Appl. No. 12/609,447, filed Oct. 30, 2009, Kariya, et al.

* cited by examiner

*Primary Examiner* — Ishwarbhai Patel
(74) *Attorney, Agent, or Firm* — Oblon, Spivak, McClelland, Maier & Neustadt, L.L.P.

(57) ABSTRACT

To provide a substrate for mounting a semiconductor element, in which fine-pitch wiring layers are formed to allow a semiconductor element to be mounted, while heat generated in the semiconductor element will not result in a decrease in reliability. Semiconductor-element mounting substrate sandwiches low-thermal-expansion substrate with upper interlayer resin layer and lower interlayer resin layer, and conductive circuit of organic substrate and first conductive circuit of low-thermal-expansion substrate are connected by via conductor formed in interlayer resin layer. Therefore, low-thermal-expansion substrate for mounting semiconductor element may be connected to organic substrate that is connected to outside substrates, without arranging an organic substrate and resin layers on the lower surface of low-thermal-expansion substrate, where impact from the thermal history of semiconductor element is notable.

9 Claims, 22 Drawing Sheets

FIG. 4
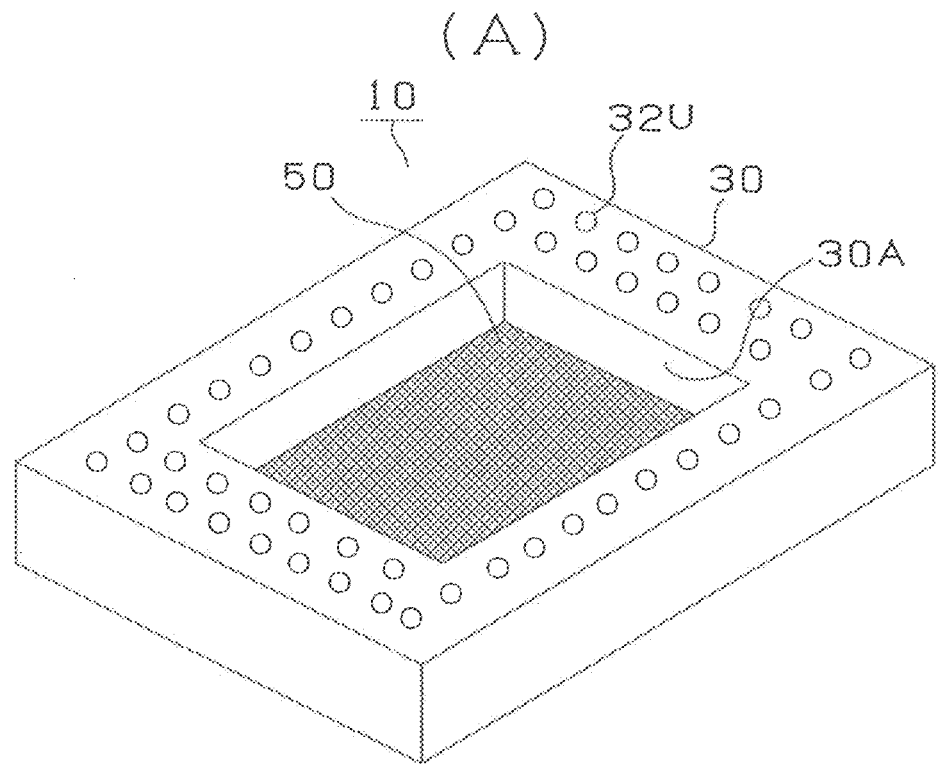
(A)
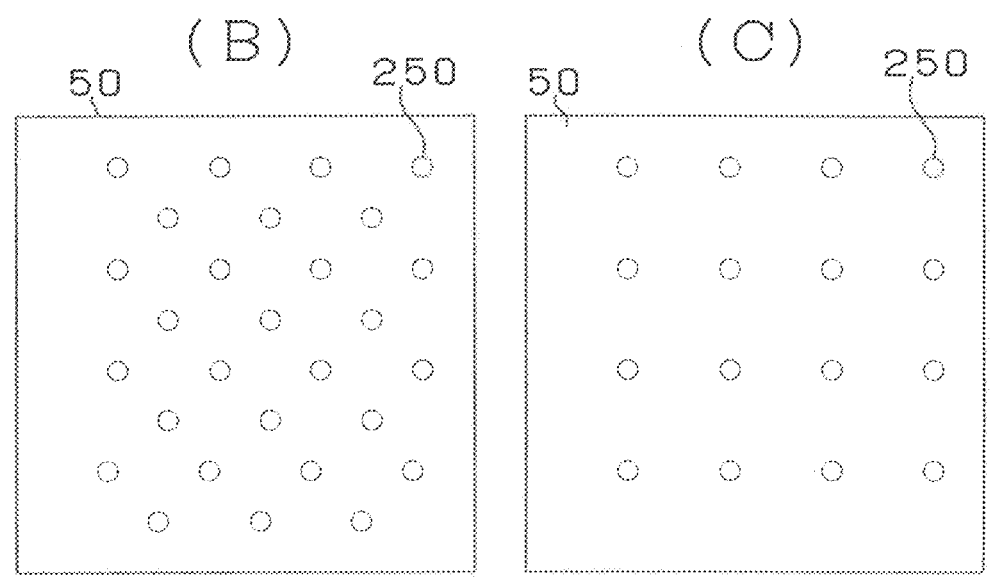
(B)    (C)

FIG. 6
(A)
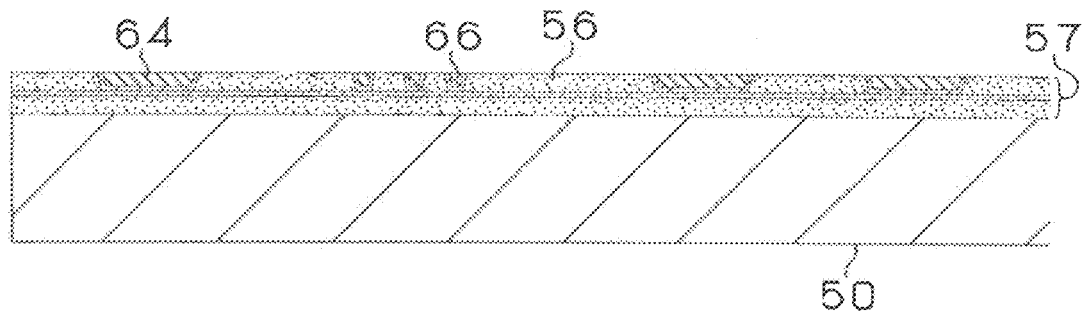
(B)
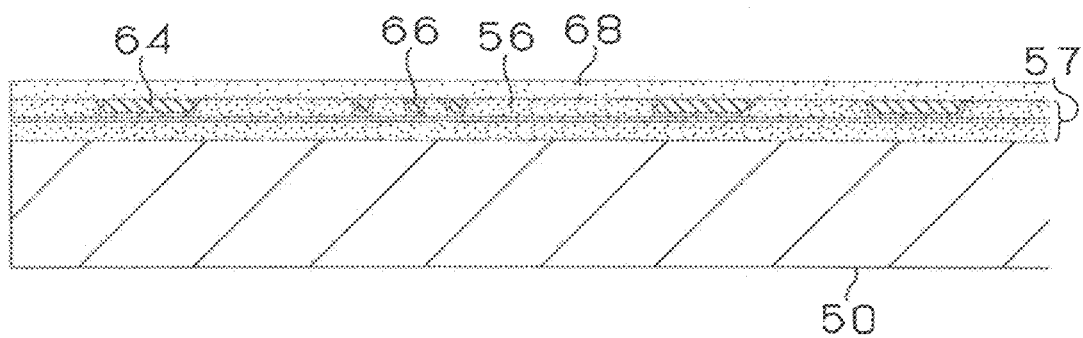
(C)
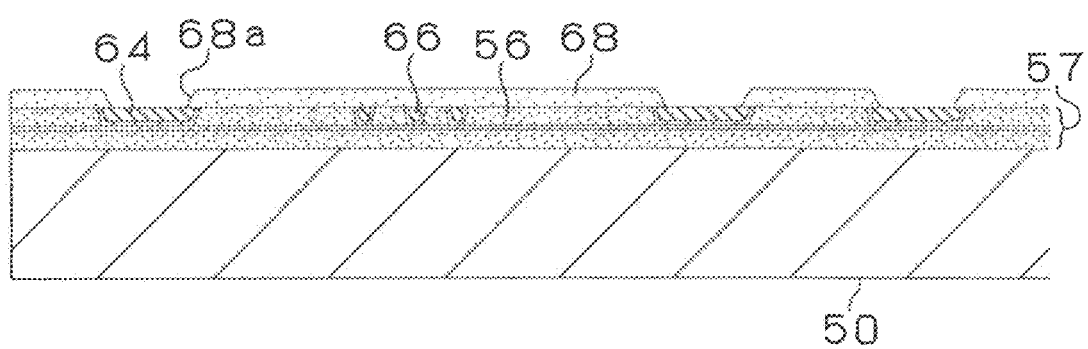

FIG. 7
(A)
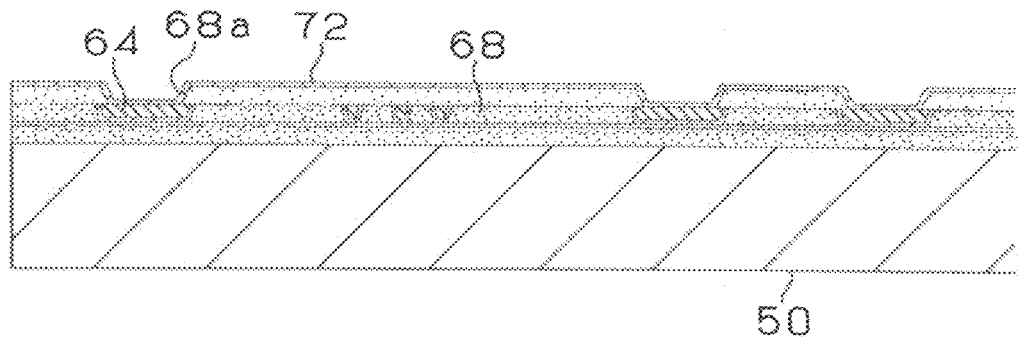
(B)
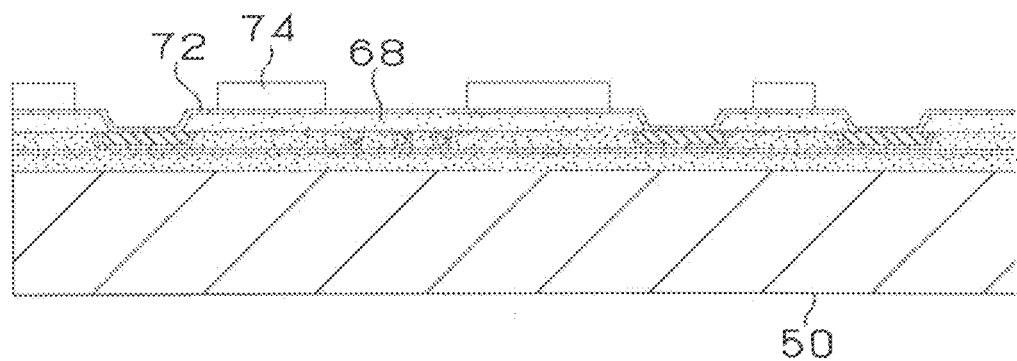
(C)
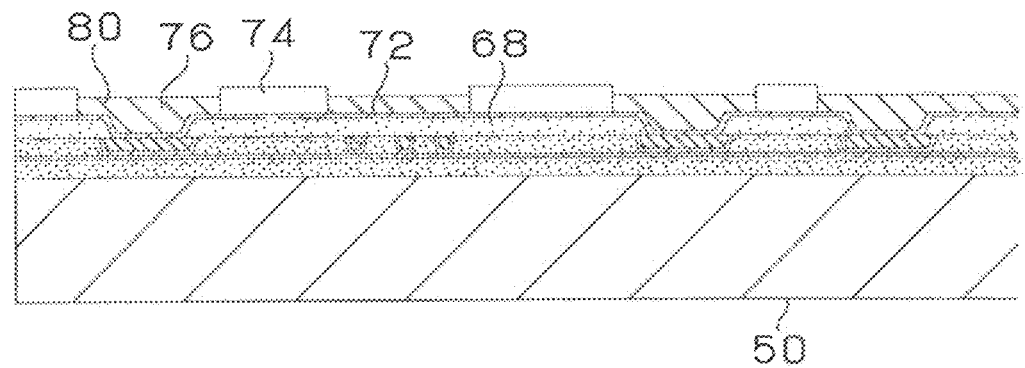

FIG. 8
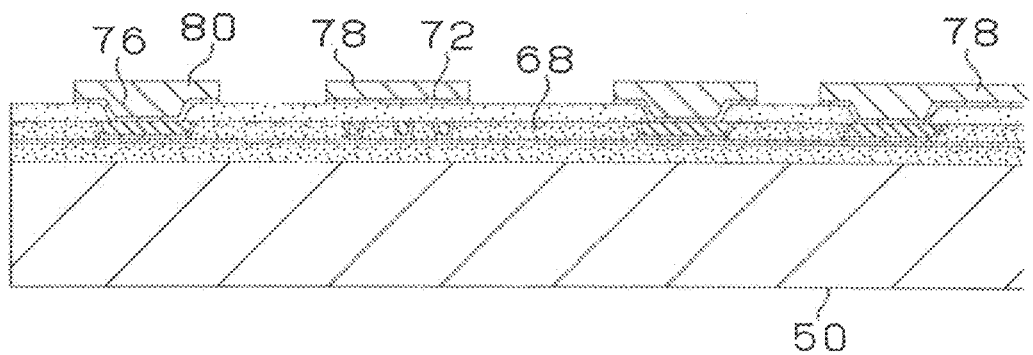
(A)
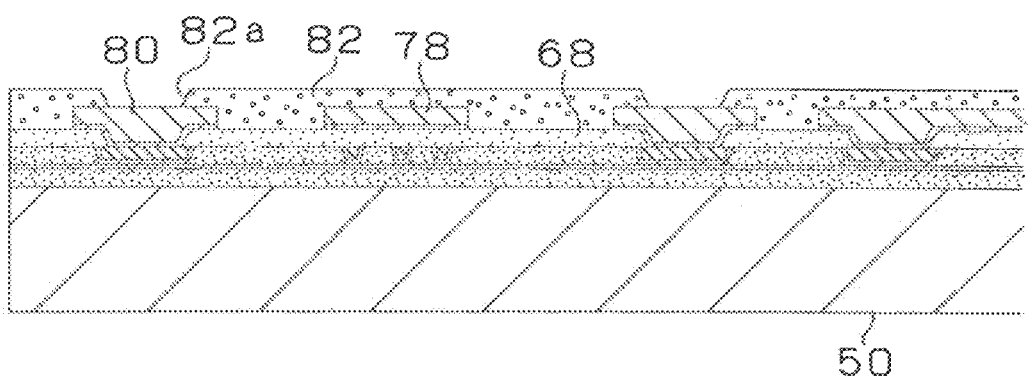
(B)
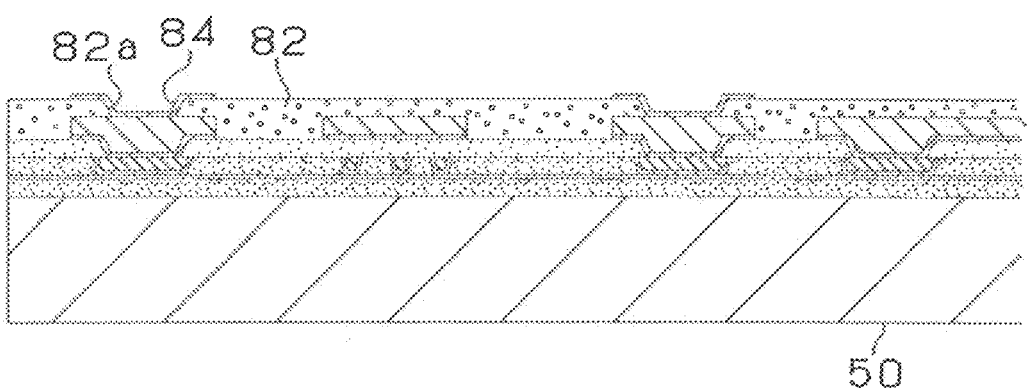
(C)

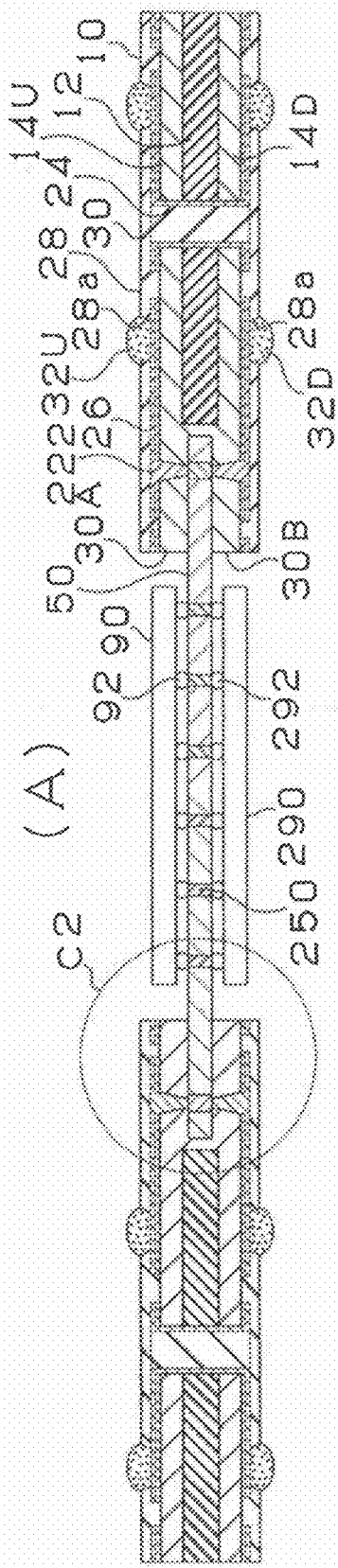
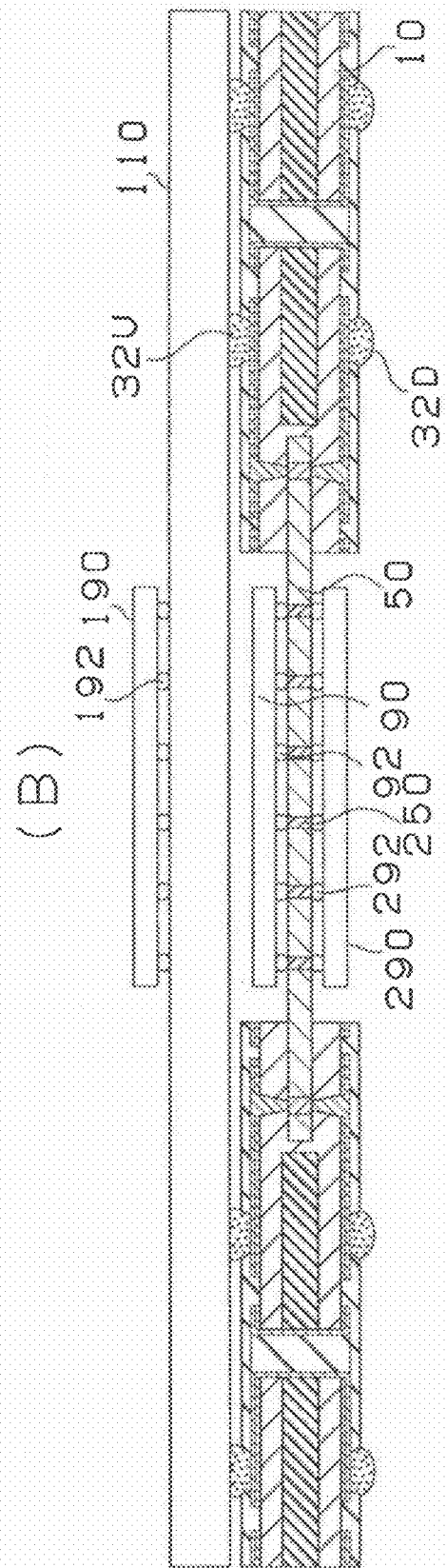
FIG. 12

FIG. 14
(A)
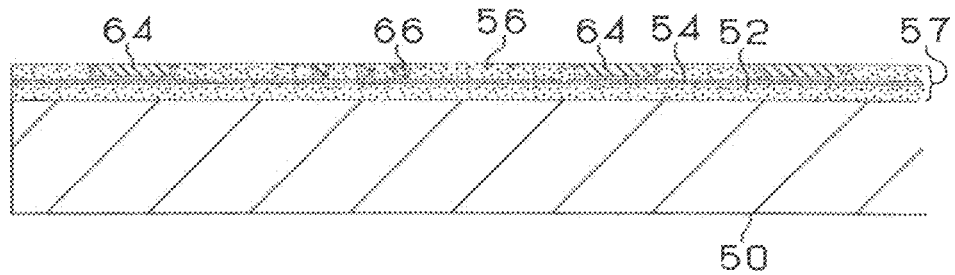
(B)
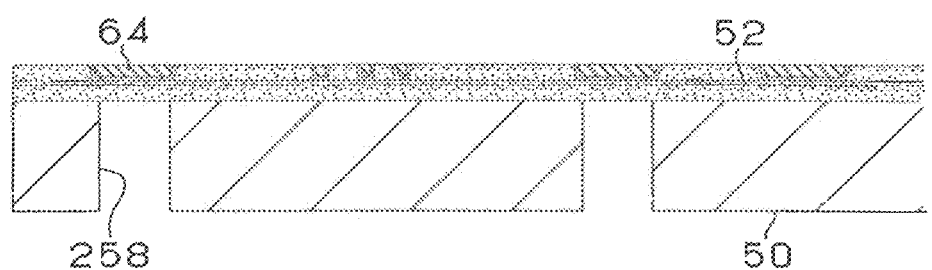
(C)
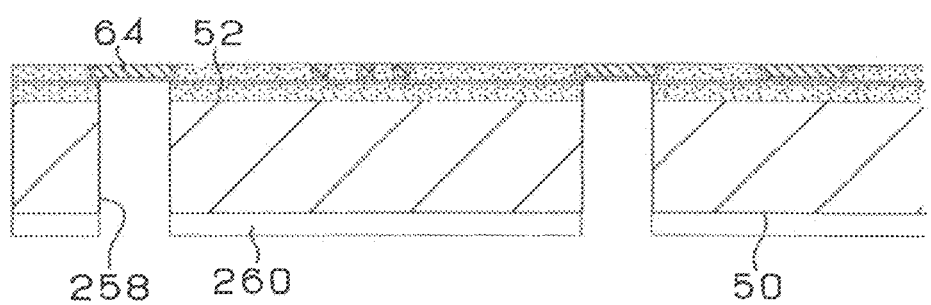
(D)
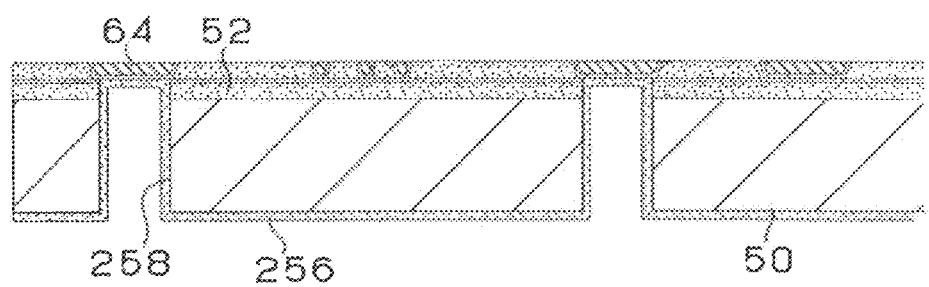

FIG. 15
(A)
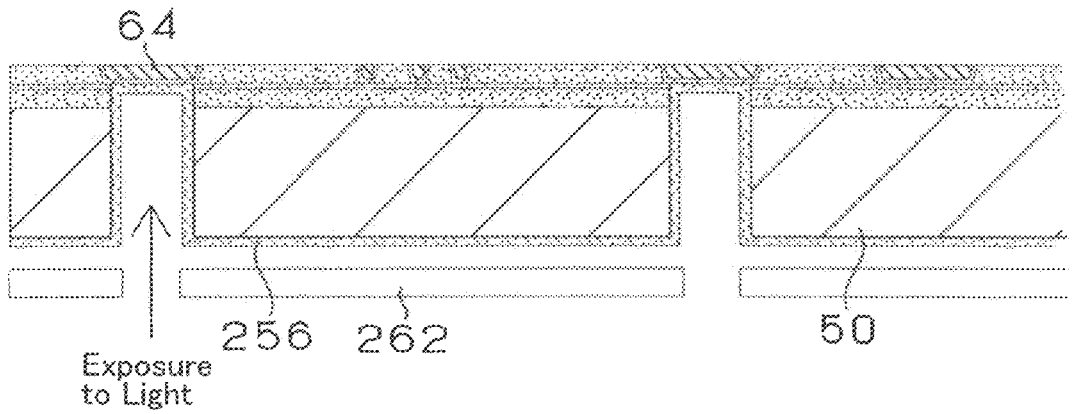
(B)
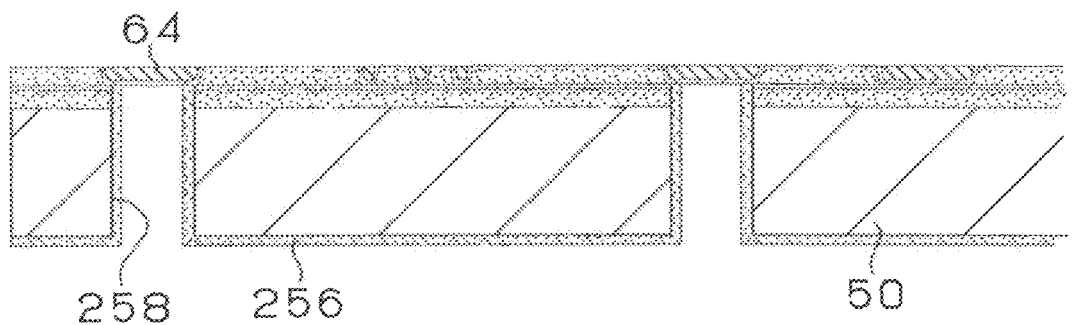
(C)
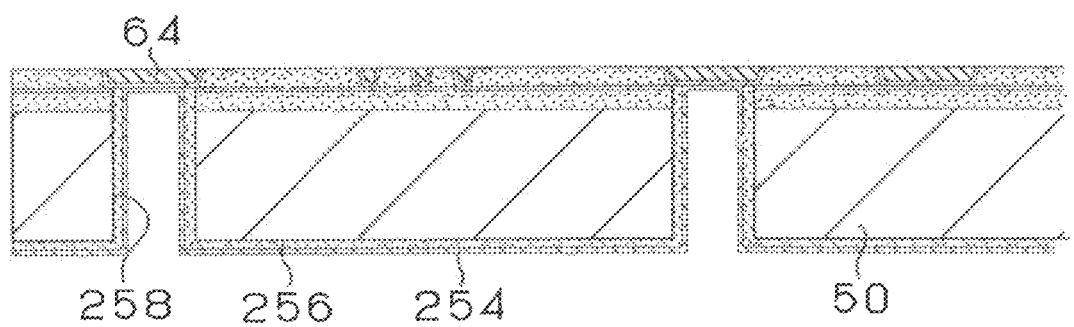

FIG. 16
(A)
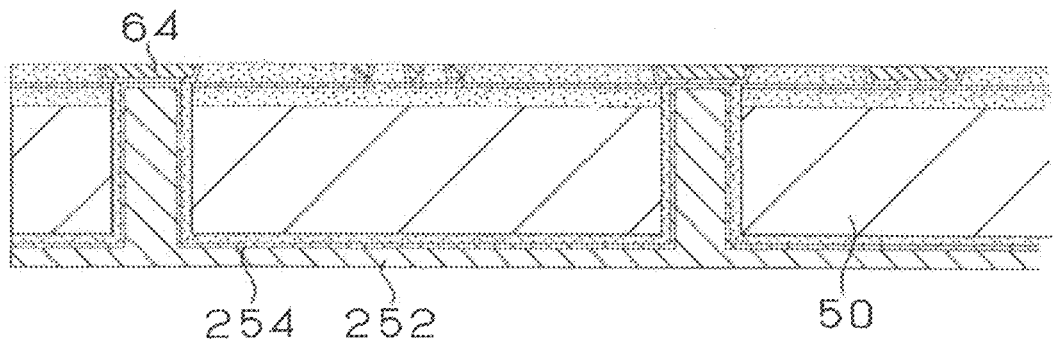
(B)
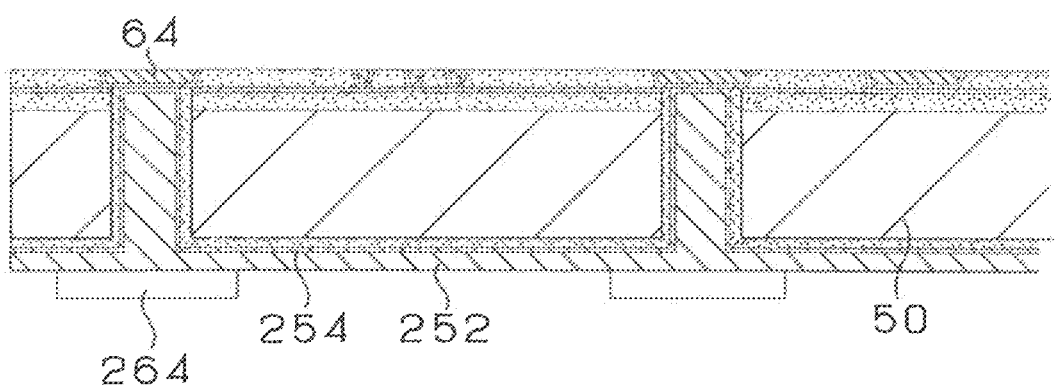
(C)
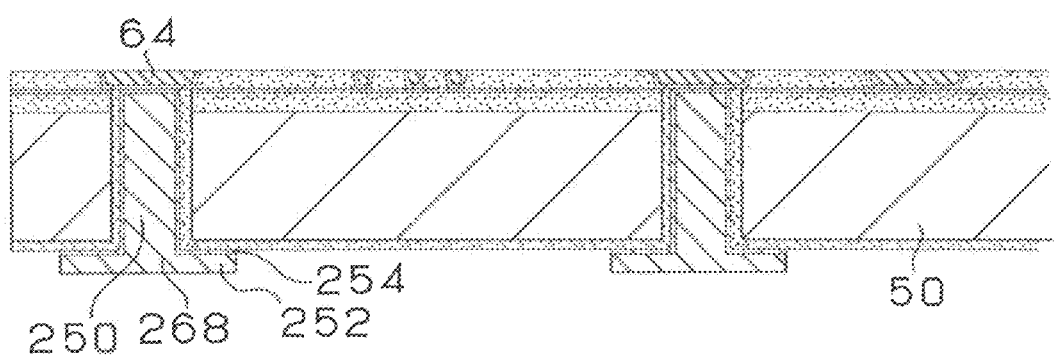

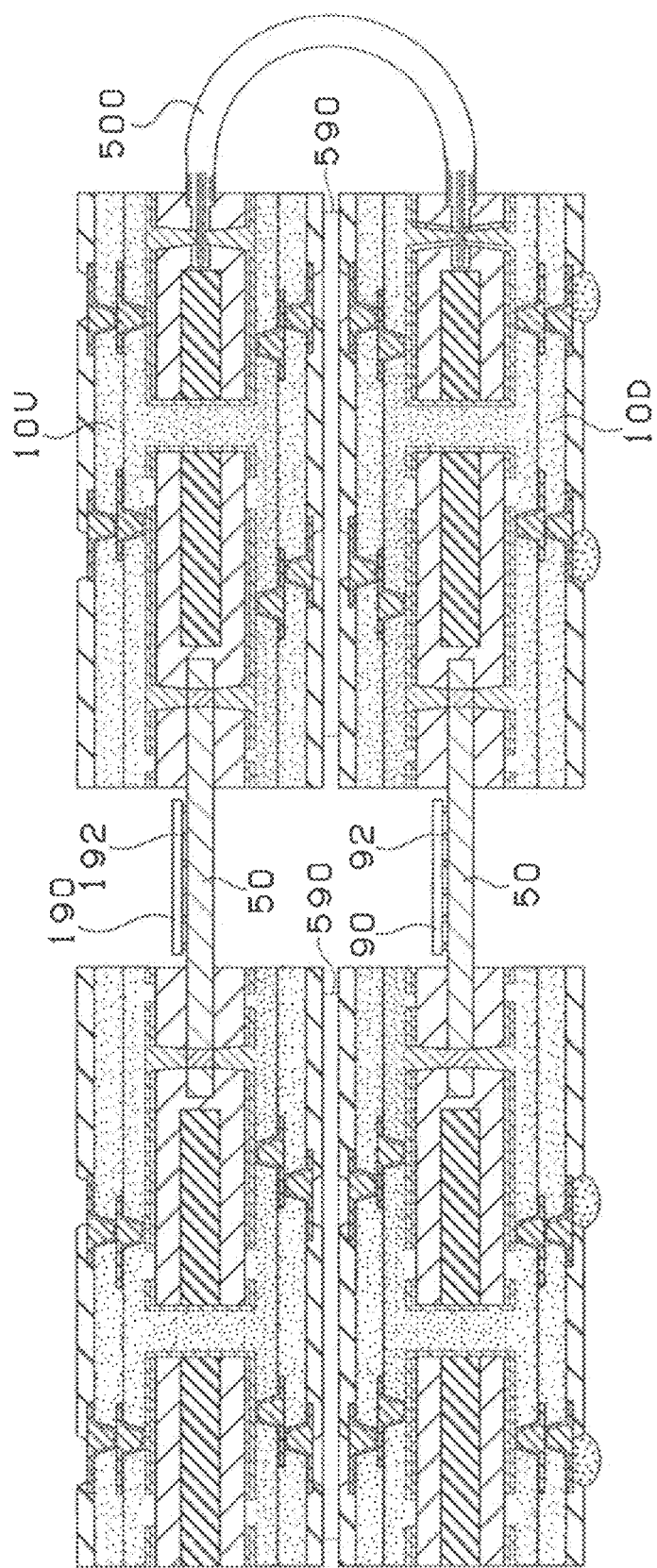

SUBSTRATE FOR MOUNTING SEMICONDUCTOR ELEMENT AND METHOD FOR MANUFACTURING SUBSTRATE FOR MOUNTING SEMICONDUCTOR ELEMENT

CROSS-REFERENCE TO RELATED APPLICATIONS

The present application claims the benefits of priority to U.S. application Ser. No. 61/159,660, filed Mar. 12, 2009, the entire content of which is hereby incorporated by reference.

BACKGROUND OF THE INVENTION

1. Field of the Invention

The present invention is related to a substrate for mounting a semiconductor element and, more specifically, to a substrate for mounting a semiconductor element to be used for package-on-package (POP), in which another substrate for mounting a semiconductor element is further mounted on the substrate for mounting a semiconductor element.

2. Description of the Related Art

As wiring in IC chips is becoming finer and more highly integrated, the number of pads formed on the uppermost layer of a mounting substrate is increasing, and the pads accordingly are becoming even further fine-pitched. As a result, the wiring pitch of the mounting substrate is becoming finer at a high pace. However, current technology for forming wiring in a resin substrate can hardly match the pace at which the wiring of IC chips is becoming more finely pitched. Therefore, in the substrate for mounting a semiconductor element disclosed in Patent Publication (1), an Si substrate in which is easier to form fine wiring is built into a resin substrate, fine wiring layers are formed on the Si substrate, and then a semiconductor element is mounted. [Patent Publication 1] Japanese Laid-Open Patent Publication 2004-281830. The contents of this publication are incorporated herein by reference in their entirety.

However, as shown in Patent Publication (1), in a substrate for mounting a semiconductor element, if an Si substrate having a low-thermal expansion coefficient and high Young's modulus is accommodated inside the resin substrate, the following problems occur:

(1) Due to a difference in thermal expansion coefficients between a resin insulation layer that forms the mounting substrate and the Si substrate, peeling may occur between the Si substrate and the resin insulation layer.

(2) Heat generated in the semiconductor element is conveyed inside the mounting substrate through the Si substrate with high thermal conductivity. As a result, due to a difference in thermal expansion coefficients between the resin insulation layer that forms the mounting substrate and metal material that forms conductive circuits, cracks originating in the edge portions of via lands of conductive circuits may occur in the resin insulation layer. Then, if such cracks that occurred in the resin insulation layer reach the Si substrate, the Si substrate with a high Young's modulus and low degree of plasticity will break accordingly, thus the electrical connection with the semiconductor element will fail.

Such problems described in above (1) and (2) tend to occur directly under the semiconductor element where impacts from thermal history are especially notable.

SUMMARY OF THE INVENTION

The present invention was carried out to solve the above problems. Its objective is to provide a substrate for mounting a semiconductor element and its manufacturing method, in which fine-pitch wiring layers are formed to allow a semiconductor element to be mounted, while the thermal history of the semiconductor element will not result in a decrease in reliability.

To achieve the above objective, a substrate for mounting a semiconductor element according to the present invention is characterized by the following: a core base material having an opening; a low-thermal-expansion substrate accommodated in the opening; in the low-thermal-expansion substrate, a first wiring layer which is formed on a mounting surface for mounting a semiconductor element, and which has a first conductive circuit and a first interlayer insulation layer; and a second wiring layer, which is formed to sandwich the periphery of the low-thermal-expansion substrate, and which has a first recessed section to expose the mounting surface of the low-thermal-expansion substrate and a second recessed section to expose the opposite side of the mounting surface of the low-thermal-expansion substrate. In such a substrate for mounting a semiconductor element, the organic substrate has a second interlayer resin layer and a second conductive circuit, and the second conductive circuit and the first conductive circuit are electrically connected by means of a conductive portion formed in the second interlayer resin layer.

In a substrate for mounting a semiconductor element of the present invention, even if a substrate for mounting a semiconductor element expands or shrinks due to the thermal history of the semiconductor element, for example, cracks that reach inside the interlayer resin layer and wiring breakage may be suppressed efficiently.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(A) is a cross-sectional view of a semiconductor-element mounting substrate according to the First Embodiment; FIG. 2(B) is a cross-sectional view showing a state in which a semiconductor-element mounting substrate is further mounted on a semiconductor-element mounting substrate of the First Embodiment;

FIG. 4: FIG. 4(A) is a perspective view of a semiconductor-element mounting substrate according to the First Embodiment; FIGS. 4(B) and 4(C) are views each showing the lower surface of a low-thermal-expansion substrate in a semiconductor-element mounting substrate according to the Third Embodiment;

FIGS. 6(A)-6(C) are views showing the steps of a method for manufacturing a low-thermal-expansion substrate according to the First Embodiment;

FIGS. 7(A)-7(C) are views showing the steps of a method for manufacturing a low-thermal-expansion substrate according to the First Embodiment;

FIGS. 8(A)-8(C) are views showing the steps of a method for manufacturing a low-thermal-expansion substrate according to the First Embodiment;

FIG. 10(A) is a cross-sectional view of a semiconductor-element mounting substrate according to the Second Embodiment; FIG. 10(B) is a cross-sectional view showing a state in which a semiconductor-element mounting substrate is further mounted on a semiconductor-element mounting substrate of the Second Embodiment; FIG. 10(C) is a cross-sectional view of a semiconductor-element mounting substrate according to a modified example of the Second Embodiment;

FIG. 12: FIG. 12(A) is a cross-sectional view of a semiconductor-element mounting substrate according to the Third Embodiment; FIG. 12(B) is a cross-sectional view showing a state in which a semiconductor-element mounting substrate is further mounted on a semiconductor-element mounting substrate of the Third Embodiment;

FIGS. 14(A)-14(D) are views showing the steps of a method for manufacturing a low-thermal-expansion substrate according to the Third Embodiment;

FIGS. 15(A)-14(C) are views showing the steps of a method for manufacturing a low-thermal-expansion substrate according to the Third Embodiment;

FIGS. 16(A)-16(C) are views showing the steps of a method for manufacturing a low-thermal-expansion substrate according to the Third Embodiment;

FIG. 22 is a cross-sectional view of a semiconductor-element mounting substrate according to the Fifth Embodiment.

DETAILED DESCRIPTION OF THE EMBODIMENTS

Figure 1:
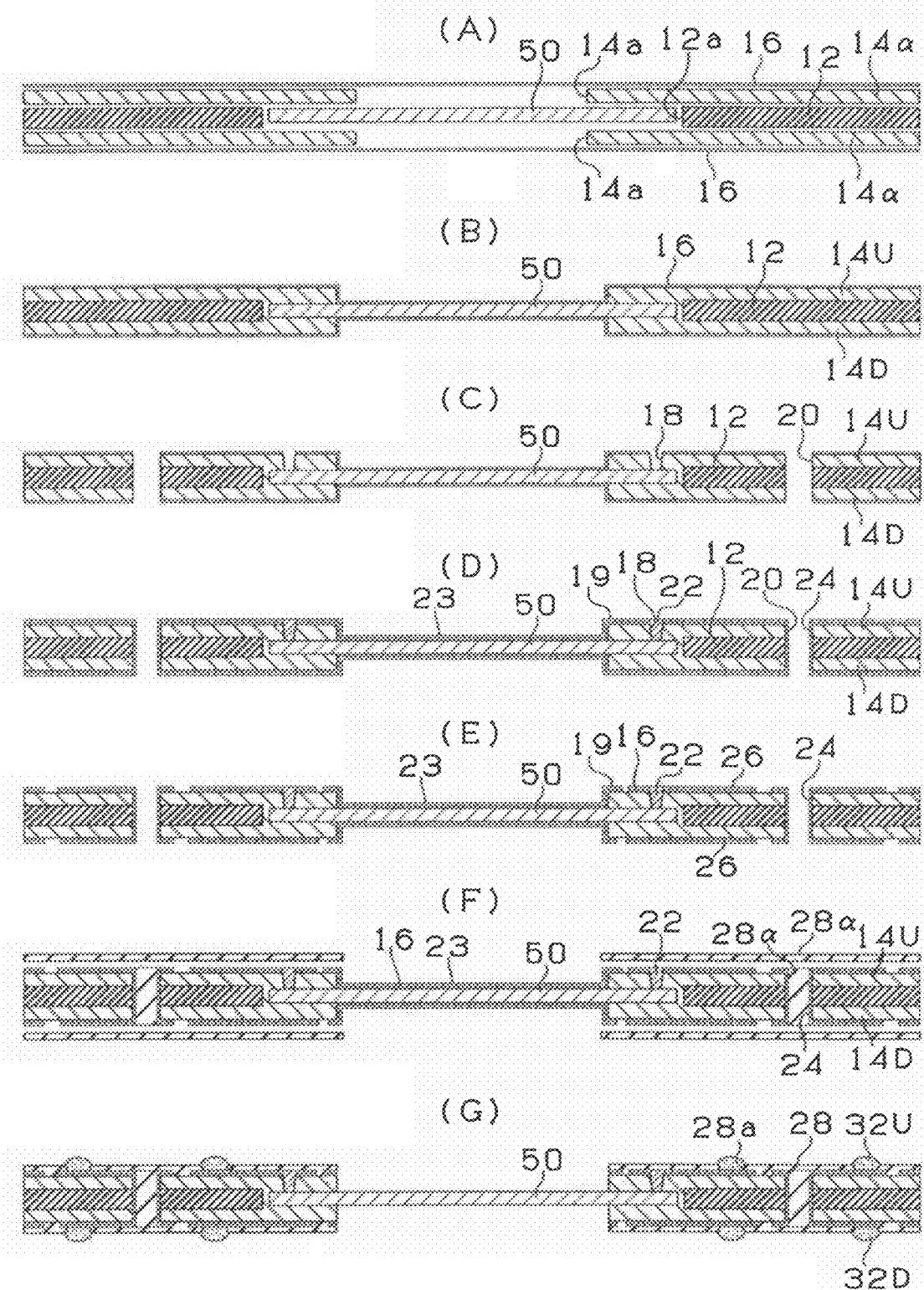
FIGS. 1(A)-1(G) are views showing the steps of a method for manufacturing a semiconductor-element mounting substrate according to the First Embodiment of the present invention.

The embodiments will now be described with reference to the accompanying drawings, wherein like reference numerals designate corresponding or identical elements throughout the various drawings.

First Embodiment

In the following, the First Embodiment of the present invention is described.

Figure 2:
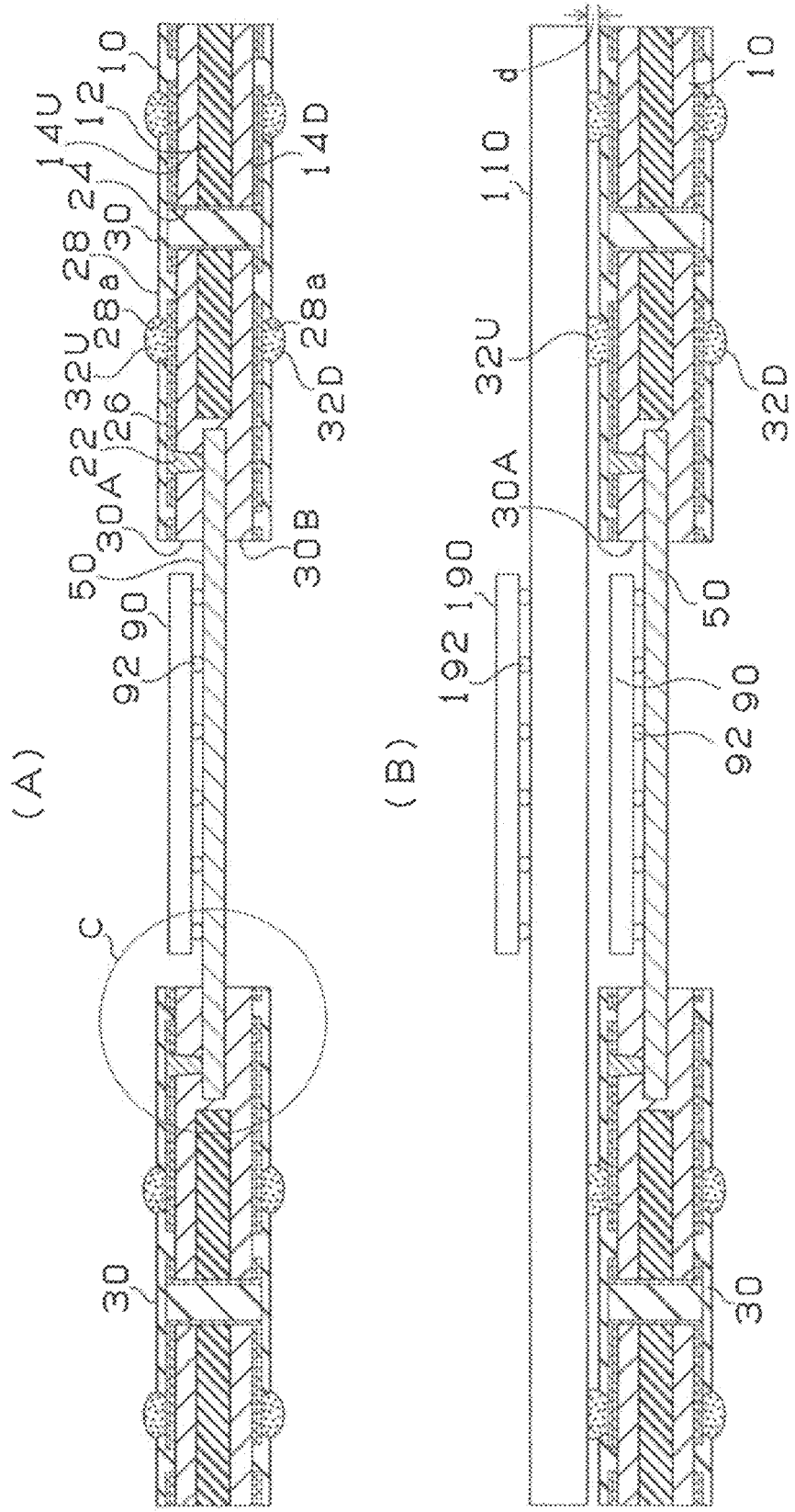
FIG. 2.

FIG. 2(A) is a cross-sectional view of semiconductor-element mounting substrate 10 of the First Embodiment, and FIG. 2(B) shows a state in which semiconductor-element mounting substrate 110 for mounting IC chip 190 is mounted on semiconductor-element mounting substrate 10 of the First Embodiment. FIG. 4(A) is a perspective view of semiconductor-element mounting substrate 10 before an IC chip is mounted. Semiconductor-element mounting substrate 10 is formed with low-thermal-expansion substrate 50, which has a low coefficient of thermal expansion (CTE) for mounting IC chip 90, and with organic substrate 30 to support low-thermal-expansion substrate 50 in an opening.

Figure 3:
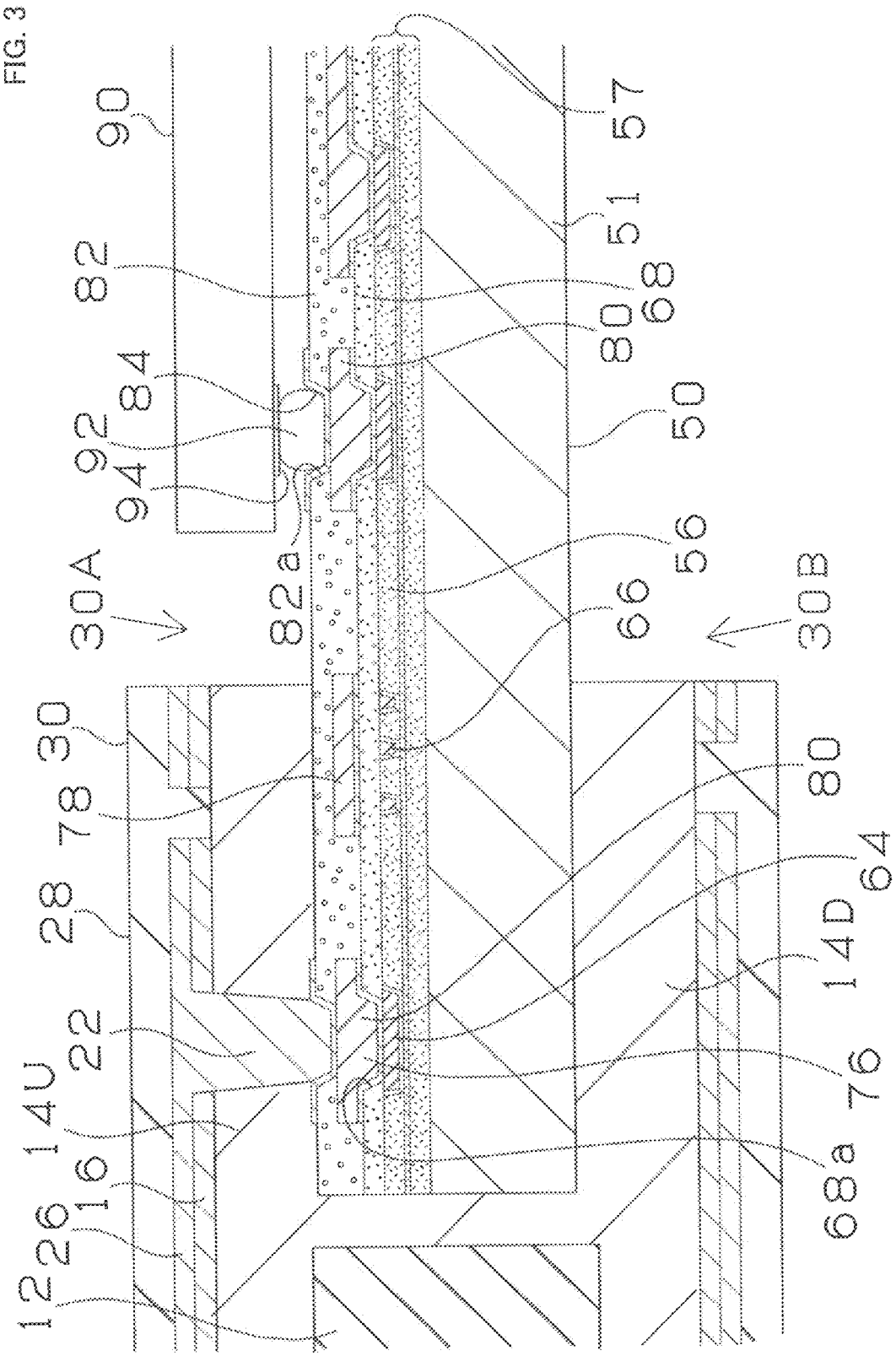
FIG. 3 is a magnified cross-sectional views showing the portion surrounded by circle (C) in FIG. 2(A)
Figure 5:
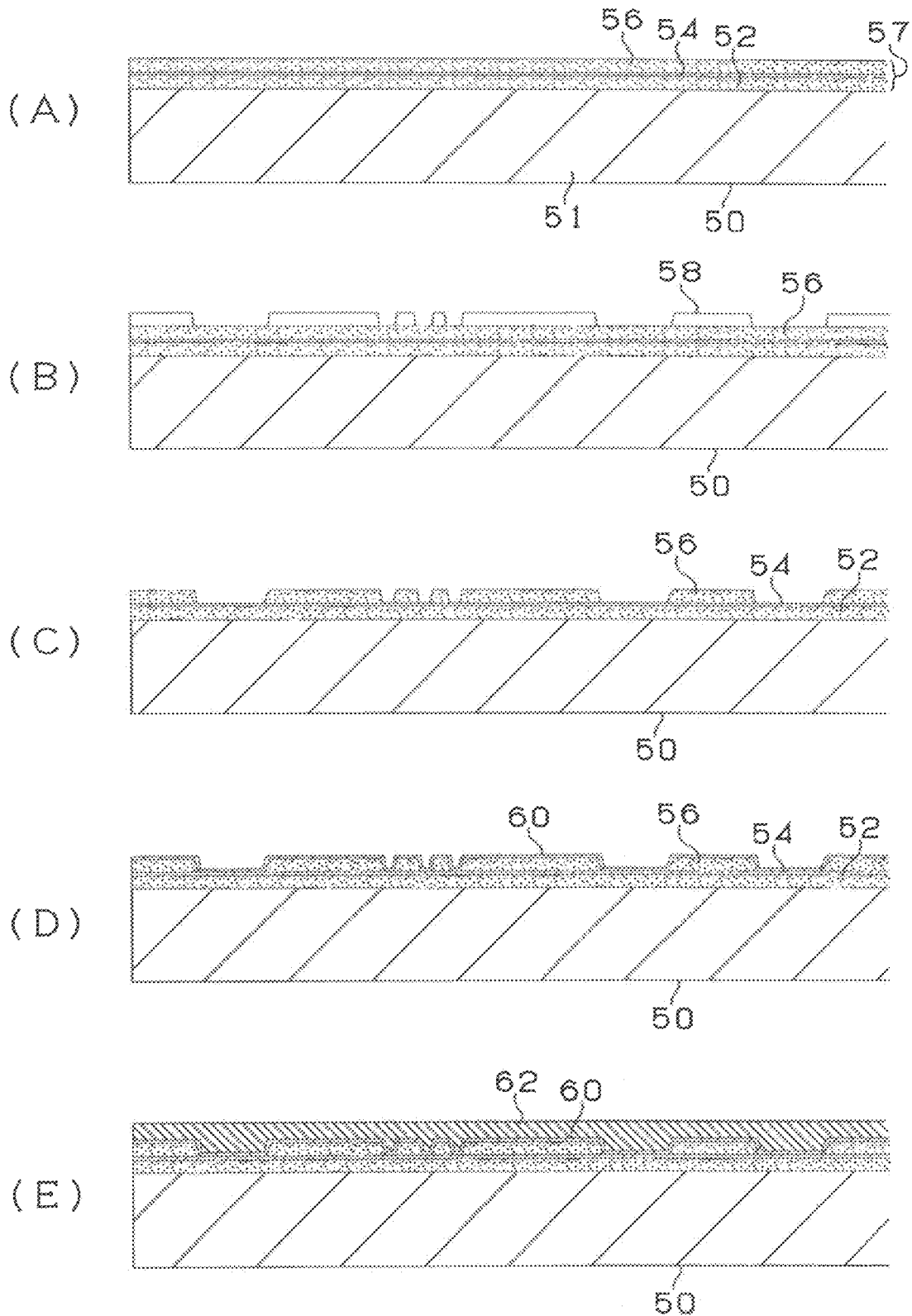
FIGS. 5(A)-5(E) are views showing the steps of a method for manufacturing a low-thermal-expansion substrate according to the First Embodiment of the present invention.

FIG. 3 is a magnified cross-sectional view showing the area surrounded by circle (C) in FIG. 2(A). Low-thermal-expansion substrate 50 has inorganic insulation layer 57 made of inorganic material; first wiring 66 and via lands 64 formed inside inorganic insulation layer 57; organic insulation layer 68 made of organic material; second wiring 78 and pads 80 formed on the surface of organic insulation layer 68; and via conductors 76 electrically connecting first wiring 66 and second wiring 78.

First, low-thermal-expansion substrate 50 is described.

As for materials to form low-thermal-expansion substrate 50 of the present invention, ceramics such as silicon, silicon nitride, silicon carbide, aluminum nitride, mullite and so forth, or low-CTE resins such as polyimide (brand name: XENOMAX®) may be used. Among those, silicon is preferred since silicon has highly flat surface characteristics that allow fine wiring to be formed. The thickness of low-thermal-expansion substrate 50 is not limited specifically, but it is preferred to be set in the range of 30-800 μm. If the thickness of low-thermal-expansion substrate 50 is less than 30 μm, its rigidity may not be achieved. On the other hand, if the thickness of low-thermal-expansion substrate 50 exceeds 800 μm, it is not preferred since that would increase the entire thickness. Inorganic insulation layer 57 of the present embodiment is made of inorganic material such as $SiO_2$ (silicon dioxide) or $Si_3N_4$ (silicon nitride). An example of a specific layer structure will be outlined in later paragraphs describing a method for manufacturing a low-thermal-expansion substrate of the present embodiment.

In inorganic insulation layer 57, multiple via lands 64 and first wiring 66 to electrically connect predetermined via lands 64 are formed. Namely, via lands 64 connected to via conductors are formed in part of first wiring 66 which is formed inside inorganic insulation layer 57, and predetermined via lands 64 are connected by first wiring 66.

First wiring 66 is formed inside inorganic insulation layer 57 in such a way that the surface of wiring 66, including the surfaces of via lands 64, is positioned at substantially the same level as the surface of inorganic insulation layer 57. The thickness of first wiling 66 is less than the thickness of later described second wiring. The thickness of first wiring 66 of the present embodiment is not limited to a specific value, but it is preferred to be set at 2 μm or less. If the thickness of first wiring 66 is 2 μm or less, finer wiring may be achieved, making it easier to adjust to highly integrated wiring inside a semiconductor element.

In addition, since first wiring 66 is formed using a damascene method, the surface made with inorganic insulation layer 57 and first wiring 66 is flat.

Also, in the present embodiment, the diameter of via lands 64 is set larger than the diameter of via conductors 76. However, the diameter of via lands 64 may also be set substantially the same as the diameter of via conductors 76. When comparing the diameter of via lands and the diameter of via conductors, the diameters at the surfaces where via lands and via conductors come in contact with each other may be compared.

Organic insulation layer 68 of the present embodiment is made of organic material and is formed on inorganic insulation layer 57 and first wiring 66. Organic insulation layer 68 has openings (68a) which expose via lands, and via conductors 76 as conductive portions are formed in openings (68a). In addition, second wiring 78 is formed on the surface of organic insulation layer 68.

Furthermore, pads 80 are formed in part of second wiring 78 formed on organic insulation layer 68. Second wiring 78 and first wiring 66 are electrically connected by means of via conductors 76. When mounting a semiconductor element, pads 80 are the portions to be connected to connection terminals of semiconductor element 90 by means of solder bumps 92 as well as the portions to be connected to via conductors 22 of organic substrate 30.

Organic insulation layer 68 is a layer made with a resin from among thermosetting resins, photosensitive resins, resins with photosensitive groups attached to part of thermosetting resins, thermoplastic resins or a resin complex containing such resins or the like. Specifically, it is preferred to be made with a photosensitive polyimide resin.

Next, protective film 82 and semiconductor element 90 are described. Protective film 82 is formed on organic insulation layer 68 and second wiring 78. Protective film 82 has openings (82a) partially exposing pads 80.

The material for protective film 82 is not limited specifically, but organic material is preferred from a viewpoint of adhesiveness with organic insulation layer 68. In openings (82a), solder bumps 92 are formed with barrier-metal layer 84 in between. Semiconductor element 90 is mounted on low-thermal-expansion substrate 50 by means of bumps 92.

Other than IC chips, passive elements such as a capacitor (C), resistor (R), inductor (L) or electro-static discharge (ESD) element may further be mounted on low-thermal-expansion substrate 50. Warping may be suppressed in low-thermal-expansion substrate 50 by being arranged symmetrically in a vertical direction.

Organic substrate 30 is described with reference to FIGS. 4(A), 3 and 2(A).

Organic substrate 30 is formed to sandwich the periphery of low-thermal-expansion substrate 50 (see FIG. 4(A)), and has first recessed section (30A) to expose the mounting surface of low-thermal-expansion substrate 50 and has second recessed section (30B) to expose the opposite side of the mounting surface of low-thermal-expansion substrate 50. Organic substrate 30 has core substrate 12, upper interlayer resin layer (14U) formed on the upper side of core substrate 12, and lower interlayer resin layer (14D) formed on the lower side of core substrate 12. Conductive circuits 26 are formed on the surfaces of upper interlayer resin layer (14U) and lower interlayer resin layer (14D). As shown in FIG. 3, pads 80 of low-thermal-expansion substrate 50 and conductive circuits 26 are connected by means of via conductors 22 formed inside upper interlayer resin layer (14U). By contrast, conductive circuits 26 on upper interlayer resin layer (14U) and conductive circuits 26 on lower interlayer resin layer (14D) are connected by means of through-hole conductors 24 that penetrate upper interlayer resin layer (14U), core substrate 12 and lower interlayer resin layer (14D). Solder-resist layers 28 are formed on the surfaces of upper interlayer resin layer (14U) and lower interlayer resin layer (14D). Solder bumps (32U, 32D) are formed in openings (28a) of solder-resist layers.

In the following, the steps of a method for manufacturing semiconductor-element mounting substrate 10 according to the First Embodiment is described with reference to FIG. 1.

Opening (12a) is formed in core substrate 12 and low-thermal-expansion substrate 50 is arranged in opening (12a). On the upper and lower sides of core substrate 12, low-flow prepreg (14α, 14α) with openings (14a), which are smaller than the external shape of low-thermal-expansion substrate 50, are arranged. Then, on the outer surfaces of prepreg (14α, 14α), metal foil 16 such as copper foil is arranged (FIG. 1(A)). Here, core substrate 12 is made by laminating multiple sheets of prepreg with a core material such as glass cloth impregnated with resin such as epoxy resin or bismaleimide triazine (BT) resin. Prepreg (14α) is made by impregnating core material such as glass cloth with resin such as epoxy or bismaleimide triazine (BT) resin. Low-flow prepreg (14α) is made by impregnating a certain amount of resin so that less resin will flow out, or by semi-curing the resin to a certain degree so that less resin will flow out.

Next, core substrate 12, prepreg (14α, 14α) and metal foil 16 are pressed and integrated (FIG. 1(B)). At that time, it is also preferred to cure prepreg (14α, 14α) by adding heat to make the prepreg first upper interlayer resin layer (14U) and first lower interlayer resin layer (14D).

In the following, after forming via openings 18 in upper interlayer resin layer (14U) by a laser, through-hole openings 20 are formed by a laser or drill to penetrate upper interlayer resin layer (14U), core substrate 12 and lower interlayer resin layer (14D) (FIG. 1(C)).

By performing electroless copper plating and electrolytic copper plating, plated-metal film 23 is formed. Accordingly, via conductors 22 are formed in via openings 18, and through-hole conductors 24 are formed in through-hole openings 20 (FIG. 1(D)).

By patterning, plated-metal film 23 and metal foil 16 are removed according to a predetermined pattern, and conductive circuits 26 are formed (FIG. 1(E)).

Next, solder-resist composition (28a) is applied on upper interlayer resin layer (14U) and lower interlayer resin layer (14D) (FIG. 1(F)). At that time, it is preferred to fill through-hole conductors with a filler in advance, then to apply solder-resist composition (28a) on interlayer resin layers (14U, 14D). Then, openings (28a) are formed in the solder-resist composition, and plated-metal film 23 and metal foil 16 on low-thermal-expansion substrate 50 are removed by etching, for example. After that, solder bumps (32U, 32D) are formed in openings (28a) of solder-resist layer 28 (FIG. 1(G)).

In the following, the process to mount a semiconductor element on semiconductor-element mounting substrate 10 of the present embodiment is described.

Solder bumps 92 are formed on barrier-metal layer 84 of the low-thermal-expansion substrate. Next, semiconductor element 90 is flip-chip mounted on low-thermal-expansion substrate 50 by means of bumps 92 (FIG. 3). Then, underfill resin is filled between semiconductor element 90 and low-thermal-expansion substrate 50, and the resin is cured (not shown in the drawings). Next, the area surrounding mounted semiconductor element 90 is encapsulated using encapsulating resin (not shown in the drawings).

In the following, a method for manufacturing a low-thermal-expansion substrate of the present embodiment is described with reference to FIGS. 5-8.

First, as shown in FIG. 5(A), inorganic insulation layer 57 (which is formed with first $SiO_2$ layer 52, $Si_3N_4$ layer 54 and second $SiO_2$ layer 56, for example) is formed on low-thermal-expansion substrate 50. As for low-thermal-expansion substrate 50 of the present embodiment, a silicon wafer is used and on the top surface of the silicon wafer, first $SiO_2$ layer 52, $Si_3N_4$ layer 54 and second $SiO_2$ layer 56 are each formed by a chemical vapor deposition (CVD) method.

Next, resist 58 is applied, exposed to light and developed. Then, portions of resist 58 are removed from predetermined spots where openings will be formed in second $SiO_2$ layer 56 (FIG. 5(B)).

Next, by dry etching (reactive ion etching), portions of second $SiO_2$ layer 56 where resist 58 is not formed are etched away. In doing so, a pattern such as shown in FIG. 5(C) is formed in second $SiO_2$ layer 56. During such dry etching, $Si_3N_4$ layer 54 works as an etching stopper.

Next, seed layer 60 is formed on the surface of second $SiO_2$ layer 56 using sputtering, for example (FIG. 5(D)). In the present embodiment, seed layer 60 is formed with TaN, Ta and Cu sputtered films from the bottom in that order; however, the present embodiment is not limited to such.

Next, using seed layer 60 as a power-supply layer, electrolytic copper plating is performed to form electrolytic copper-plated layer 62 (FIG. 5(E)). Such electrolytic copper plating may be performed using a conventionally known method.

Next, chemical mechanical polishing (CMP) is conducted to remove electrolytic copper-plated layer 62, and seed layer 60 on the surface of second $SiO_2$ layer 56 (FIG. 6(A)). Such CMP may be conducted using a method and equipment known in a conventional damascene method. The portions of the electrolytic copper-plated layer remaining after the CMP become via lands 64 and first wiring portions 66. Through the process conducted so far, inorganic insulation layer and first wiring may be formed. In addition, on the, surfaces of inorganic insulation layer and first wiring, inorganic thin film such as $Si_3N_4$ may also be formed using CVD, for example. Such inorganic thin film is formed to improve adhesiveness between the organic insulation layer and inorganic insulation layer.

In the following, forming an organic insulation layer is described. First, on inorganic insulation layer 57 and first wiring 66, organic insulation layer 68 is formed (FIG. 6(B)), in which openings (68a) are formed (FIG. 6(C)). To form organic insulation layer 68, a method such as applying uncured photosensitive polyimide resin using a roll coater, for example, may be used. To form openings, an exposure and development treatment may be used.

Next, seed layer 72 is formed on the surface of organic insulation layer 68 (including the wall surfaces of openings (68a)) and top surfaces of via lands 64 exposed through openings (68a)) (FIG. 7(A)). Seed layer 72 is formed by sputtering, for example, and is made up of TiN, Ti and Cu in that order, for example, from the surface of organic insulation layer 68 in the present embodiment. By using TiN in seed layer 72, copper ion diffusion may be effectively suppressed from occurring in copper plating that forms wiring. The structure of seed layer 72 is not limited to the above.

Next, plating resist 74 is formed, and then exposed and developed through a mask to remove portions of plating resist 74 from areas where second wiring will be formed (FIG. 7(B)). As for such a plating resist, a liquid resist may be used, for example.

Then, electrolytic copper plating is performed using seed layer 72 as a power-supply layer to form copper plating in the areas where plating resist 74 was removed (FIG. 7(C)). In doing so, via conductors 76 are formed in organic insulation layer 68. In addition, pads 80 and second wiring 78 are formed on organic insulation layer 68.

Next, the remaining resist is removed, and seed layer 72 under the removed plating resist is etched away as well (FIG. 8(A)). Etching seed layer 72 is not limited to any specific method; however, dry etching (reactive ion etching) is preferred in terms of suppressing over-etching of electrolytic plated copper.

Through the steps so far, the organic insulation layer and second wiring may be formed.

In the following, another organic insulation layer 82 is formed on organic insulation layer 68. Then, openings (82a) are formed on the newly formed organic insulation layer 82. This newly formed organic insulation layer 82 will become protective film (FIG. 8(B)). The same material as for organic insulation layer 68 may be used for organic insulation layer 82 as protective film. Also, when forming openings (82a), the same method for forming openings (68a) in organic insulation layer 68 may be used.

Next, barrier-metal layer 84 is formed in openings (82a) formed in organic insulation layer 82 (FIG. 8(C)). Barrier-metal layer 84 may be formed by sputtering, for example, tantalum nitride and tantalum in that order. However, the material and method for forming barrier-metal layer 84 are not limited to anything specific. Although omitted from being shown in the drawings, Ni/Au plating is performed on the surface of barrier-metal layer 84 exposed through the openings of the protective film. Such film is formed to ensure adhesiveness between solder and pads when later-described soldering is conducted. Protective film and barrier-metal layers are formed according to requirements.

When forming a low-thermal-expansion substrate on a silicon wafer as a support substrate, by using a silicon wafer sufficiently large for the size of a low-thermal-expansion substrate, multiple low-thermal-expansion substrates may be formed on a sheet of silicon wafer. When multiple low-thermal-expansion substrates are formed on a sheet of silicon wafer, low-thermal-expansion substrates may be divided into units by cutting the silicon-wafer sheet by dicing or the like either before or after the process of mounting semiconductor elements. In doing so, low-thermal-expansion substrates may be efficiently manufactured.

In semiconductor-element mounting substrate 10 of the First Embodiment, fine wiring with a fine pitch may be formed on the low-thermal-expansion substrate for mounting an IC chip. Thus, its size may be notably reduced compared with a conventional substrate for POP packaging.

In semiconductor-element mounting substrate 10 of the First Embodiment, low-thermal-expansion substrate 50 is sandwiched by upper interlayer resin layer (14U) and lower interlayer resin layer (14D), and conductive circuits 26 of organic substrate 30 and first conductive circuits 80 of low-thermal-expansion substrate 50 are connected by means of via conductors 22 formed in interlayer resin layer (14U). In organic substrate 30, first recessed section (30A) to secure the region for mounting a semiconductor element, and second recessed section (30B), opposite the first recessed section, to expose low-thermal-expansion substrate 50 are formed. Therefore, without forming organic substrates and resin layers on the lower side of low-thermal-expansion substrate 50, which is susceptible to the thermal history of semiconductor element 90, low-thermal-expansion substrate 50 for mounting semiconductor element 90 may be connected to organic substrate 30 which is used for connecting to external substrates.

In semiconductor-element mounting substrate 10 of the First Embodiment, highly rigid core substrate 12 is built into organic substrate 30. Therefore, the strength of organic substrate 30 is increased, and the reliability of the semiconductor-element mounting substrate may be improved.

In semiconductor-element mounting substrate 10 of the First Embodiment, the thermal expansion coefficient of lowthermal-expansion substrate 50 is set in the range of 2.5-10 ppm. Accordingly, the difference in thermal expansion coefficients between mounted semiconductor element 90 and low-thermal-expansion substrate 50 will decrease. Thus, cracks caused by thermal stress due to their different thermal expansion coefficients will seldom occur in solder bumps.

In semiconductor-element mounting substrate 10 of the First Embodiment, highly rigid silicon with a low coefficient of thermal expansion may be used for the low-thermal-expansion substrate. In doing so, fine wiring with a fine-pitch may be formed on the low-thermal-expansion substrate, while ensuring the connection reliability of solder bumps as described above.

In semiconductor-element mounting substrate 10 of the First Embodiment, as shown in FIG. 2(B), since semiconductor element 90 is accommodated in first recessed section (30A), semiconductor element 90 does not protrude or seldom protrudes from the top surface of the semiconductor-element mounting substrate. Thus, distance (d) may be reduced between printed wiring board 110 to be mounted on the upper side and the top surface of the semiconductor-element mounting substrate. Accordingly, upper-side printed wiring board 110 and semiconductor-element mounting substrate 10 may be connected by bumps (32U) with a smaller diameter. Thus, forming fine-pitch bumps may become easier.

In semiconductor-element mounting substrate 10 of the First Embodiment, semiconductor element 90 may be mounted by means of bumps 92. Bumps 92 are formed on conductive circuits 80 exposed through openings (82a) of protective film 82 which is formed on outermost conductive circuits 80 and interlayer insulation layer 68.

In semiconductor-element mounting substrate 10 of the First Embodiment, bumps (32U) are formed on conductive circuits 26 exposed through openings (28a) of solder-resist layer 28 which are formed on upper-side outermost conductive circuits 26 and interlayer resin layer (14U). Upper-side printed wiring board 110 may be connected to the substrate by means of bumps (32U).

In semiconductor-element mounting substrate 10 of the First Embodiment, since low-thermal-expansion substrate 50 and organic substrate 30 are formed in a vertical and bilateral symmetrical structure, warping may be suppressed. Moreover, by using a low-thermal-expansion substrate having substantially the same thermal expansion coefficient as the IC chip, the mounting reliability of the IC chip may be improved.

Forming wiring layers on semiconductor-element mounting substrate 10 is not limited to any specific method, and wiring layers may be formed using only a semi-additive method.

Second Embodiment

Figure 9:
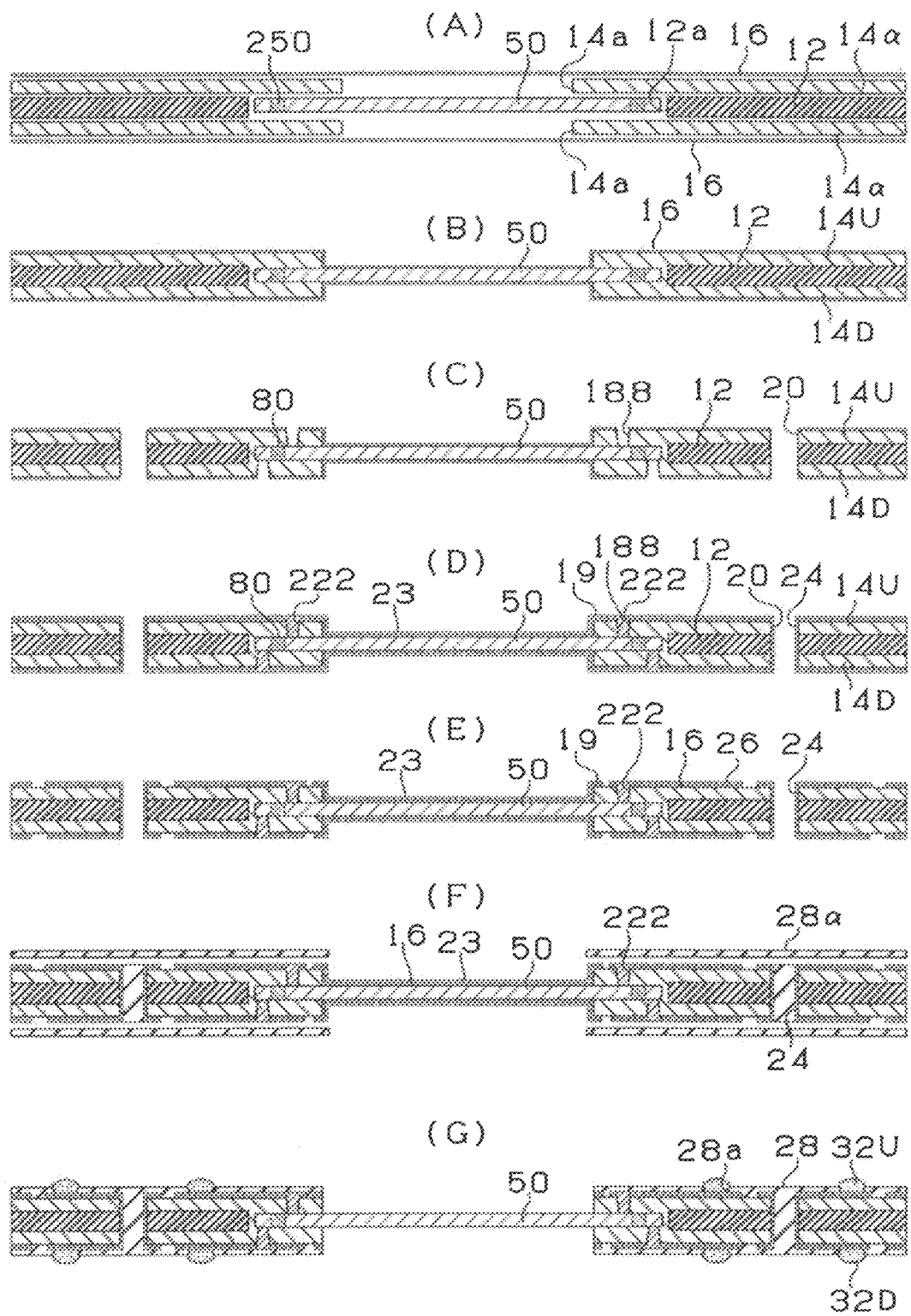
FIGS. 9(A)-9(G) are views showing the steps of a method for manufacturing a semiconductor-element mounting substrate according to the Second Embodiment of the present invention.
Figure 10:
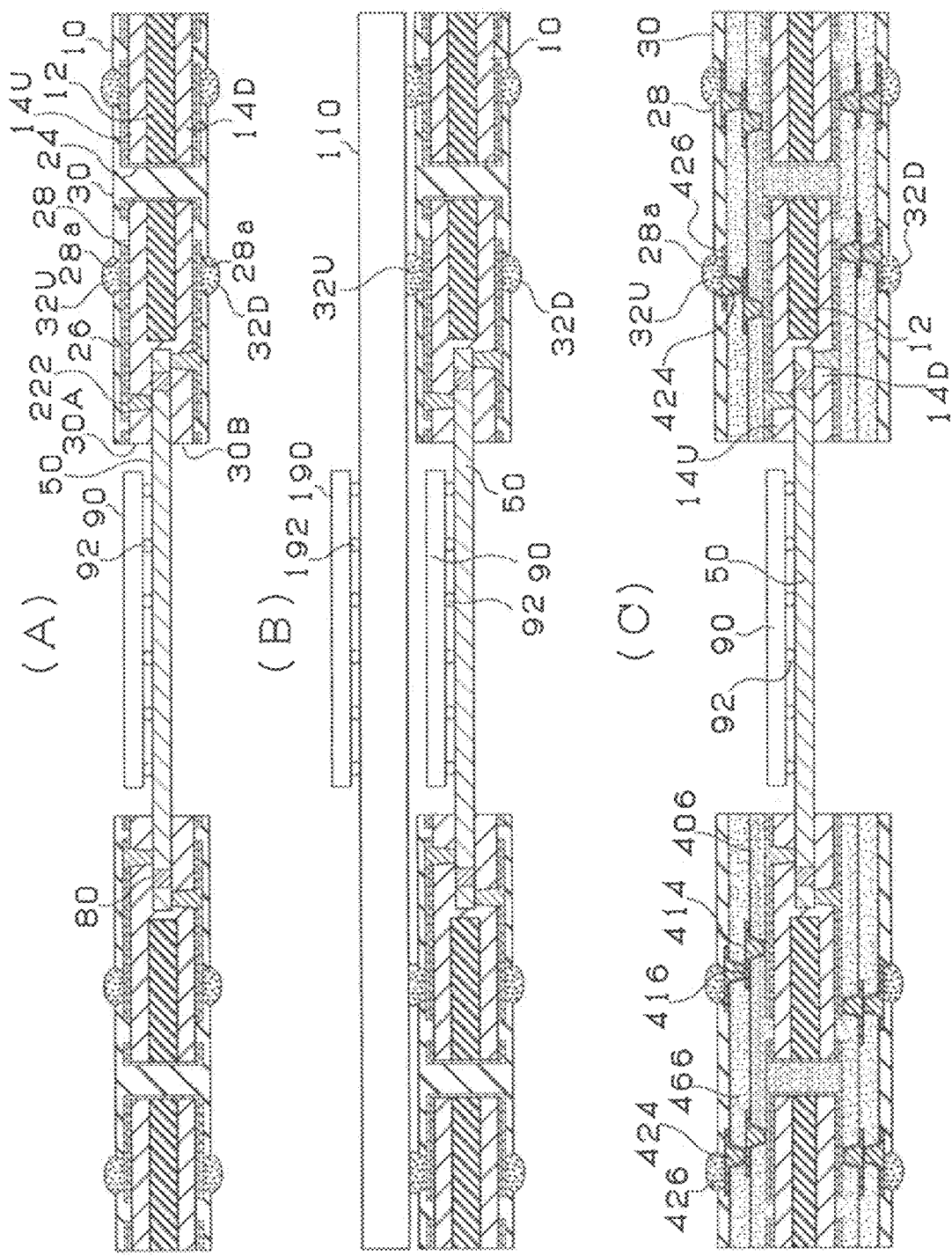
FIG. 10.

The Second Embodiment is described with reference to FIGS. 9 and 10. FIG. 10(A) is a cross-sectional view of semiconductor-element mounting substrate 10 according to the Second Embodiment; and FIG. 10(B) is a view showing a state in which semiconductor-element mounting substrate 110 with mounted IC chip 190 is further mounted on semiconductor-element mounting substrate 10 of the Second Embodiment. Semiconductor-element mounting substrate 10 is formed with low-thermal-expansion substrate 50 having a low CTE to mount IC chip 90, and with organic substrate 30 to support low-thermal-expansion substrate 50 in an opening.

In the First Embodiment, as described above by referring to FIG. 3, conductive circuits 26 of organic substrate 30 are connected to first conductive circuits 80 of low-thermal-expansion substrate 50 by means of via conductors 22 formed in interlayer resin layer (14U). By contrast, in the Second Embodiment, conductive circuits 26 of organic substrate 30 are connected to conductive circuits 80 of low-thermal-expansion substrate 50 by means of through-hole conductors 222 which penetrate upper interlayer resin layer (14U), core substrate 12 and lower interlayer resin layer (14D). In such a case, conductive circuits on upper interlayer resin layer (14U) and conductive circuits on lower interlayer resin layer (14D) are connected by means of through-hole conductors 222.

In the following, a method for manufacturing semiconductor-element mounting substrate 10 according to the Second Embodiment is described.

Opening (12a) is formed in core substrate 12, and low-thermal-expansion substrate 50 is accommodated in opening (12a). On the upper and lower sides of core substrate 12, low-flow prepreg (14α, 14α) with openings (14a), which are smaller than the external shape of low-thermal-expansion substrate 50, is arranged. Then, on the outer surfaces of prepreg (14α, 14α), metal foil 16 such as copper foil is arranged (FIG. 9(A)). Penetrating electrodes 250 are preferred to be formed in advance in the peripheral portions of low-thermal-expansion substrate 50. A method for forming penetrating electrodes 250 will be described later in the Third Embodiment. Core substrate 12 is formed by laminating multiple sheets of prepreg made by impregnating core material such as glass cloth with resin such as epoxy resin or bismaleimide triazine (BT) resin and then curing such prepreg. Prepreg (14α) is made by impregnating core material such as glass cloth with resin such as epoxy resin or bismaleimide triazine (BT) resin.

Next, core substrate 12, prepreg (14α, 14α) and metal foil 16 are pressed and integrated (FIG. 9(B)). At that time, it is also preferred to cure prepreg (14α, 14α) by adding heat to make the prepreg upper interlayer resin layer (14U) and lower interlayer resin layer (14D).

In the following, via openings 188 are formed by a laser or drill in upper interlayer resin layer (14U) and lower interlayer resin layer (14D), and through-hole openings 20 are formed to penetrate upper interlayer resin layer (14U), core substrate 12 and lower interlayer resin layer (14D) (FIG. 9(C)). Then, plated-metal film 23 is formed by performing electroless copper plating and electrolytic copper plating in that order on the surfaces of via openings 188, through-hole openings 20 and metal foil 16 (FIG. 9(D)). Then, plated-metal film 23 is patterned by etching to form conductive circuits 26 on upper interlayer resin layer (14U), conductive circuits 26 on lower interlayer resin layer (14D), via conductors 222 and through-hole conductors 24 (FIG. 9(E)).

In the following, solder-resist composition (28α) is applied on upper interlayer resin layer (14U) and lower interlayer resin layer (14D) to form solder-resist layers 28 (FIG. 9(F)). At that time, resin filler may be filled inside through-hole conductors 24 prior to application of the solder-resist composition. Alternatively, solder-resist composition (28a) may be filled inside through-hole conductors 24 (FIG. 9(F)).

After that, openings (28a) are formed in predetermined spots of solder-resist layers 28, and solder bumps (32U, 32D) are formed in openings (28a) (FIG. 9(G)). Then, metal foil 16, plated-metal film 23 and solder-resist layer 28, which are formed on the low thermal-expansion substrate, are removed using a laser, for example. The order in such a removal process may be changed appropriately according to requirements.

Next, a process to mount a semiconductor element on semiconductor-element mounting substrate 10 of the present embodiment is described.

Solder bumps 92 are formed on barrier-metal layer 84 of the low-thermal-expansion substrate. Then, semiconductor element 90 is flip-chip mounted on low-thermal-expansion substrate 50 by means of bumps 92 (FIG. 10(A)). Then, underfill resin is filled between semiconductor element 90 and low-thermal-expansion substrate 50 and cured (not shown in the drawings). In the following, the area surrounding mounted semiconductor element 90 is encapsulated with encapsulating resin (not shown in the drawings). Since the method for manufacturing a low-thermal-expansion substrate of the Second Embodiment is the same as in the First Embodiment described above with reference to FIGS. 5-8, its description is omitted here.

The same effects as in the above First Embodiment are achieved in the semiconductor-element mounting substrate of the Second Embodiment. In addition, in the Second Embodiment, by means of through-hole conductors which penetrate the low-thermal-expansion substrate, power-source circuits are formed from the power-source on a motherboard to semiconductor element 90, for example. Accordingly, the distance of the power-source circuits from the power source to semiconductor element 90 is reduced, compared with the First Embodiment. Thus, loop inductance or voltage drop may be suppressed efficiently.

Further, built-up layers may further be formed on interlayer resin layers (14D, 14U) described above. In such a case, after other interlayer resin layers 406 are formed on interlayer resin layers (14D, 14U), via openings are formed by a laser, for example. Then, as described previously, via conductors 414 are formed to connect conductive circuits 416 and conductive circuits 26. In the same manner, after forming interlayer resin layers 466, via conductors 424 are formed to connect conductive circuits 426 and conductive circuits 416 (FIG. 10(C)).

Third Embodiment

Figure 11:
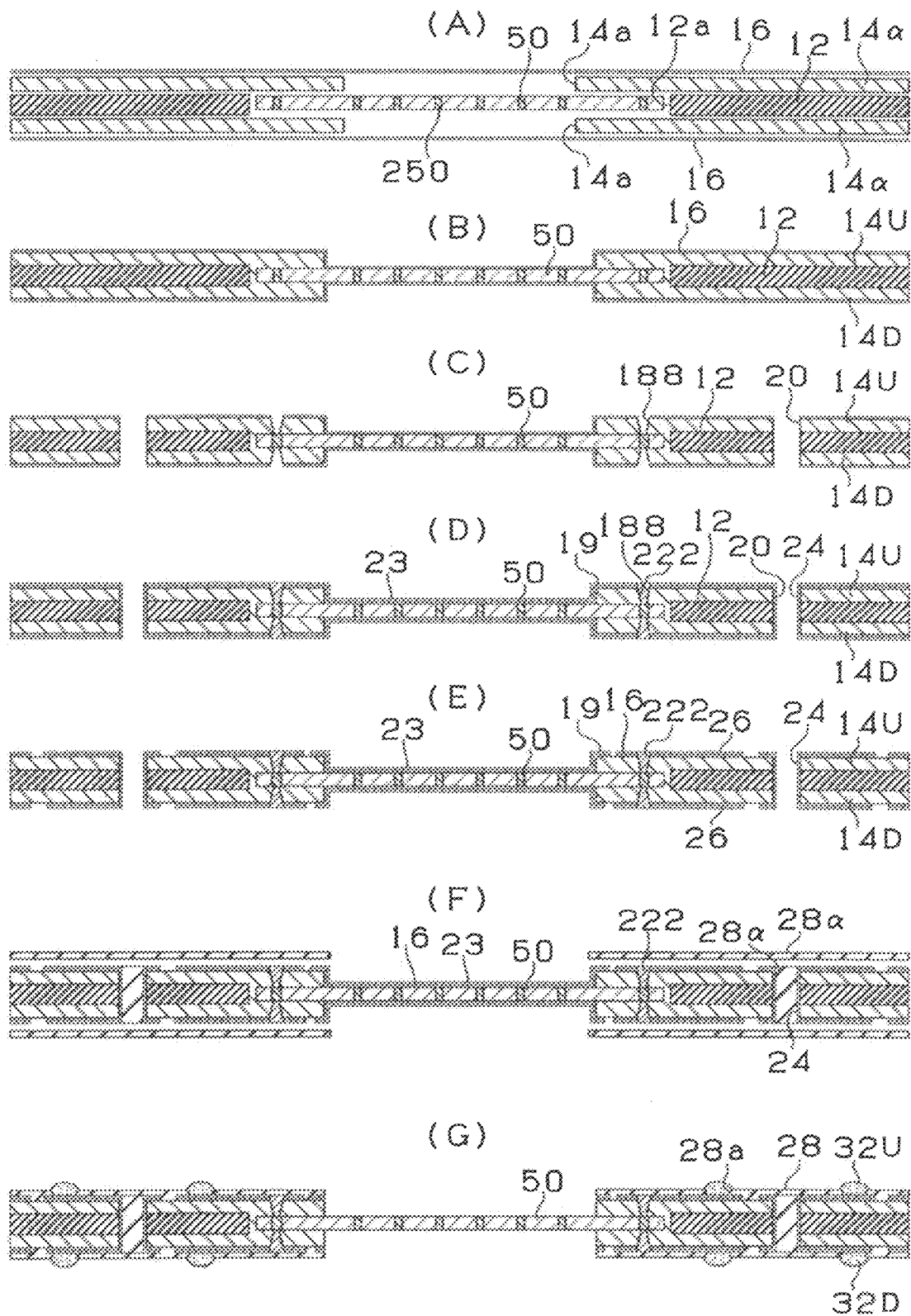
FIGS. 11(A)-11(G) are views showing the steps of a method for manufacturing a semiconductor-element mounting substrate according to the Third Embodiment of the present invention.

The Third Embodiment is described with reference to FIGS. 11-13.

FIG. 12(A) is a cross-sectional view showing semiconductor-element mounting substrate 10 of the Third Embodiment; and FIG. 12(B) is a view showing a state in which semiconductor-element mounting substrate 110 with mounted IC chip 190 is further mounted on semiconductor-element mounting substrate 10 of the Third Embodiment. Semiconductor-element mounting substrate 10 is formed with low-thermal-expansion substrate 50 having a low CTE to mount IC chip 90, and with organic substrate 30 to support low-thermal-expansion substrate 50 in an opening.

In the First Embodiment, IC chip 90 is mounted on the upper side of low-thermal-expansion substrate 50. By contrast, in the Third Embodiment, penetrating electrodes 250 which penetrate from the upper surface to the lower surface of low-thermal-expansion substrate 50 are formed to allow IC chip 190 to be mounted on the lower side in addition to IC chip 90 mounted on the upper side.

Figure 13:
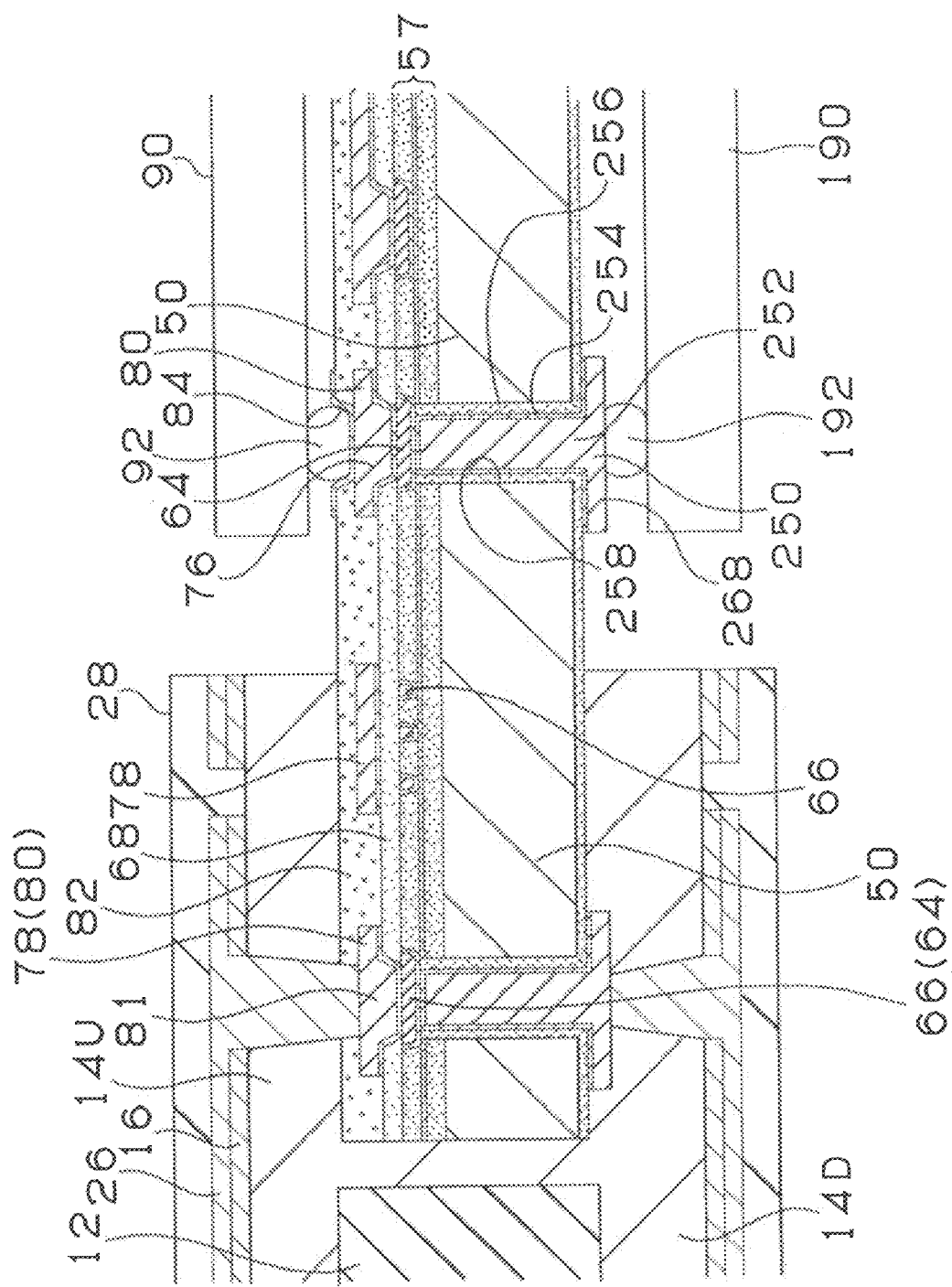
FIG. 13 is a magnified cross-sectional view showing the portion surrounded by circle (C2) in FIG. 12(A)

FIG. 13 is a magnified cross-sectional view of the portion surrounded by circle (C2) in FIG. 12(A). The same as in the First Embodiment, low-thermal-expansion substrate 50 of the Third Embodiment has inorganic insulation layer 57 made with inorganic material; first wiring 66 and via lands 64 formed inside inorganic layer 57; organic insulation layer 68 made with organic material; second wiring 78 and pads 80 formed on the surface of organic insulation layer 68; and via conductors 81 as the conductive portions which electrically connect first wiring 66 and second wiring 78. Moreover, in the Third Embodiment, penetrating electrodes 250 are formed in a zigzag array (see FIG. 4(B)) or grid array (see FIG. 4(C)) on the entire surface of low-thermal-expansion substrate 50. Accordingly, the upper and lower surfaces of the low-thermal-expansion substrate are electrically connected, allowing semiconductor element 190 to be mounted on the lower side of the low-thermal-expansion substrate as well.

Penetrating electrodes 250 are made of copper-plated layer 252 and conductive thin film 254 under the copper-plated layer. Penetrating electrodes 250 and low-thermal-expansion substrate 50 are separated by insulative film 256, which is also formed on the entire lower surface of low-thermal-expansion substrate 50.

The top sides (upper side of the support substrate) of penetrating electrodes 250 are connected to the conductor (via lands 64 in FIG. 13) formed inside inorganic insulation layer 57. The bottom sides (the lower side of the support substrate) of penetrating electrodes 250 are connected to pads 268 (wiring) formed on the lower surface of low-thermal-expansion substrate 50. Namely, pads 268 (wiring) formed on the lower surface of low-thermal-expansion substrate are electrically connected to first wiring 66 (via lands 64) by means of penetrating electrodes 250. Also, bumps 192 are formed on pads 268. IC chip 190 is mounted on the lower surface of low-thermal-expansion substrate 50 by means of bumps 192. Underfill resin is filled between printed wiring board 100 and low-thermal-expansion substrate 50 (not shown in the drawings).

The material for insulative film 256 is not limited to anything specific, but inorganic insulative film such as $SiO_2$ film or organic insulative film made from resin may be used. An example shown here uses organic insulative film for insulative film 256.

In the following, the steps of manufacturing semiconductor-element mounting substrate 10 according to the Third Embodiment are described.

The method for manufacturing a low-thermal-expansion substrate of the Third Embodiment is substantially the same as the method for manufacturing a low-thermal-expansion substrate of the First Embodiment except for the process to form penetrating electrodes. Accordingly, regarding the method for manufacturing a low-thermal-expansion substrate of the Third Embodiment, only the steps different from those in the method for manufacturing a low-thermal-expansion substrate of the First Embodiment are described with reference to FIGS. 14-16.

In the present embodiment, the same process is taken as in the method for manufacturing a low-thermal-expansion substrate according to the First Embodiment, and a substrate is manufactured to have the same structure as shown in FIG. 5(A) described in the First Embodiment (see FIG. 14(A)).

Next, using a UV laser, for example, openings 258 are formed in predetermined spots of low-thermal-expansion substrate 50 (FIG. 14(B)). Forming openings 258 is not limited to any specific method; however, dry etching (reactive ion etching) or wet etching using an alkaline etchant or the like may be employed. Furthermore, resist 260 is patterned to expose openings 258 (FIG. 14(C)). After that, dry etching (reactive ion etching) is conducted using resist 260 as a mask to etch first $SiO_2$ layer 52 and $Si_3N_4$ layer 54 in that order. Accordingly, the lower surfaces of via lands 64 are exposed.

Next, liquid resin is applied to the lower surface of low-thermal-expansion substrate 50 using a dip-coating method or a spin-coating method. Then, the coated resin is dried at approximately 200° C. for an hour to form insulative film 256 (FIG. 14(D)). During that time, insulative film 256 is formed on the lower surface of low-thermal-expansion substrate 50 and the wall surfaces of openings 258. As for the liquid resin used in that step, photosensitive resin (for example, brand name: WPR, series: 2580 made by JSR Corp.) is preferred from such a viewpoint that insulative film 256 on the surfaces of via lands 64 can be easily removed as described later. More specifically, liquid resin containing the following is used: methyl-ethyl ketone 20-30 weight %; ethyl lactate 20-30 weight %; filler 15-25 weight %; nobolac resin 5-15 weight %; melamine compound 1-10 weight %; phenol resin 1-10 weight %; crosslinked rubber 1-10 weight %; epoxy compound 1-5 weight %; low-molecular-weight phenol resin 1-5 weight %; coupling agent 0.1-3 weight %; and triazine-based photosensitive agent 0.1-3 weight %. To form organic insulative film, vacuum deposition, for example, may also be used other than a spin-coating method or dip-coating method.

Next, the substrate is exposed to light by means of mask 262 with openings corresponding to openings 258 (FIG. 15(A)). Then, the substrate is developed and the exposed portions of insulative film 256 (bottoms of openings 258) are removed (FIG. 15(B)). Through such a process, the lower surfaces of via lands 64 are exposed again on the lower side of low-thermal-expansion substrate 50.

Next, conductive thin film 254 is formed on the exposed lower surfaces of via lands 64 and on the surface of insulative film 256 (FIG. 15(C)). Conductive thin film 254 is made with Ni/Cu, for example, and formed by sputtering. Forming conductive thin film 254 is not limited to sputtering, but for example, electroless plating may also be used. Moreover, electrolytic copper plating is performed using conductive thin film 254 as a power-source layer to form copper-plated layer 252 (FIG. 16(A)).

Next, resist 264 is formed on areas of copper-plated layer 252 where pads will be formed (FIG. 16(B)). Then, portions of copper-plated layer 252 and conductive thin film 254 where resist 264 is not formed are removed by etching (FIG. 16(C)). By such a. step, penetrating electrodes 250 and pads 268 are formed.

In the following, the steps to accommodate a low-thermal-expansion substrate in an organic substrate are described with reference to FIG. 11. Opening (12a) is formed in core substrate 12, and low-thermal-expansion substrate 50 is accommodated in opening (12a). On the upper and lower sides of core substrate 12, low-flow prepreg (14α, 14α) with openings (14a), which are smaller than the external shape of low-thermal-expansion substrate 50, is arranged. Then, on the outer surfaces of prepreg (14α, 14α), metal foil 16 such as copper foil is arranged (FIG. 11(A)). Here, core substrate 12 is made by laminating multiple sheets of prepreg with a core material such as glass cloth impregnated with resin such as epoxy resin or bismaleimide triazine (BT) resin, then by curing the prepreg. Prepreg (14α) is made by impregnating core material such as glass cloth with resin such as epoxy or bismaleimide triazine (BT) resin.

Next, core substrate 12, prepreg (14α, 14α) and metal foil 16 are pressed and integrated (FIG. 11(B)). At that time, it is also preferred to cure prepreg (14α, 14α) by adding heat to make the prepreg upper interlayer resin layer (14U) and lower interlayer resin layer (14D).

Using a laser or drill, openings are formed which penetrate interlayer resin layers (14U, 14D) and expose penetrating electrodes. In addition, through-hole openings 20 are formed to penetrate upper interlayer resin layer (14U), core substrate 12 and lower interlayer resin layer (14D) (FIG. 11(C)). Next, plated-metal film 23 is formed by performing electroless copper plating and electrolytic copper plating on the surfaces of via openings 188, through-hole openings 20 and metal foil 16 (FIG. 11(D)). Then, plated film 23 is patterned by etching to form conductive circuits 26 on upper interlayer resin layer (14U), conductive circuits 26 on lower interlayer resin layer (14D), via conductors 222 and through-hole conductors 24 (FIG. 11(E)).

In the following, solder-resist composition (28a) is applied on upper interlayer resin layer (14U) and lower interlayer resin layer (14D) to form solder resist layers 28 (FIG. 11(F)). At that time, resin filler may be filled inside through-hole conductors 24 prior to applying the solder-resist composition, or solder resist composition (28a) may be filled inside through-hole conductors 24.

After that, openings (28a) are formed in the predetermined spots of solder-resist layers 28, and solder bumps (32U, 32D) are formed in openings (28a) (FIG. 11(G)). Then, metal foil 16, plated-metal film 23 and solder-resist layers 28 formed on the low-thermal-expansion substrate are removed using a laser, for example. The order of such a removal process may be changed appropriately according to requirements.

In the following, steps for mounting a semiconductor element on semiconductor-element mounting substrate 10 according to the present invention are described. Solder bumps 92 are formed on barrier-metal layer 84 of the low-thermal-expansion substrate. Next, semiconductor element 90 is flip-chip mounted on low-thermal-expansion substrate 50 by means of bumps 92 (FIG. 13). Then, underfill resin is filled between semiconductor element 90 and low-thermal-expansion substrate 50, and the resin is cured (not shown in the drawings). In the following, the area surrounding mounted semiconductor element 90 is encapsulated using encapsulating resin (not shown in the drawings).

In semiconductor-element mounting substrate 10 of the Third Embodiment, through-hole conductors (penetrating electrodes) 250 are formed to reach from the mounting surface to the lower surface of low-thermal-expansion substrate 50, thus allowing a semiconductor element to be mounted on the lower side of low-thermal-expansion substrate 50.

Fourth Embodiment

Figure 17:
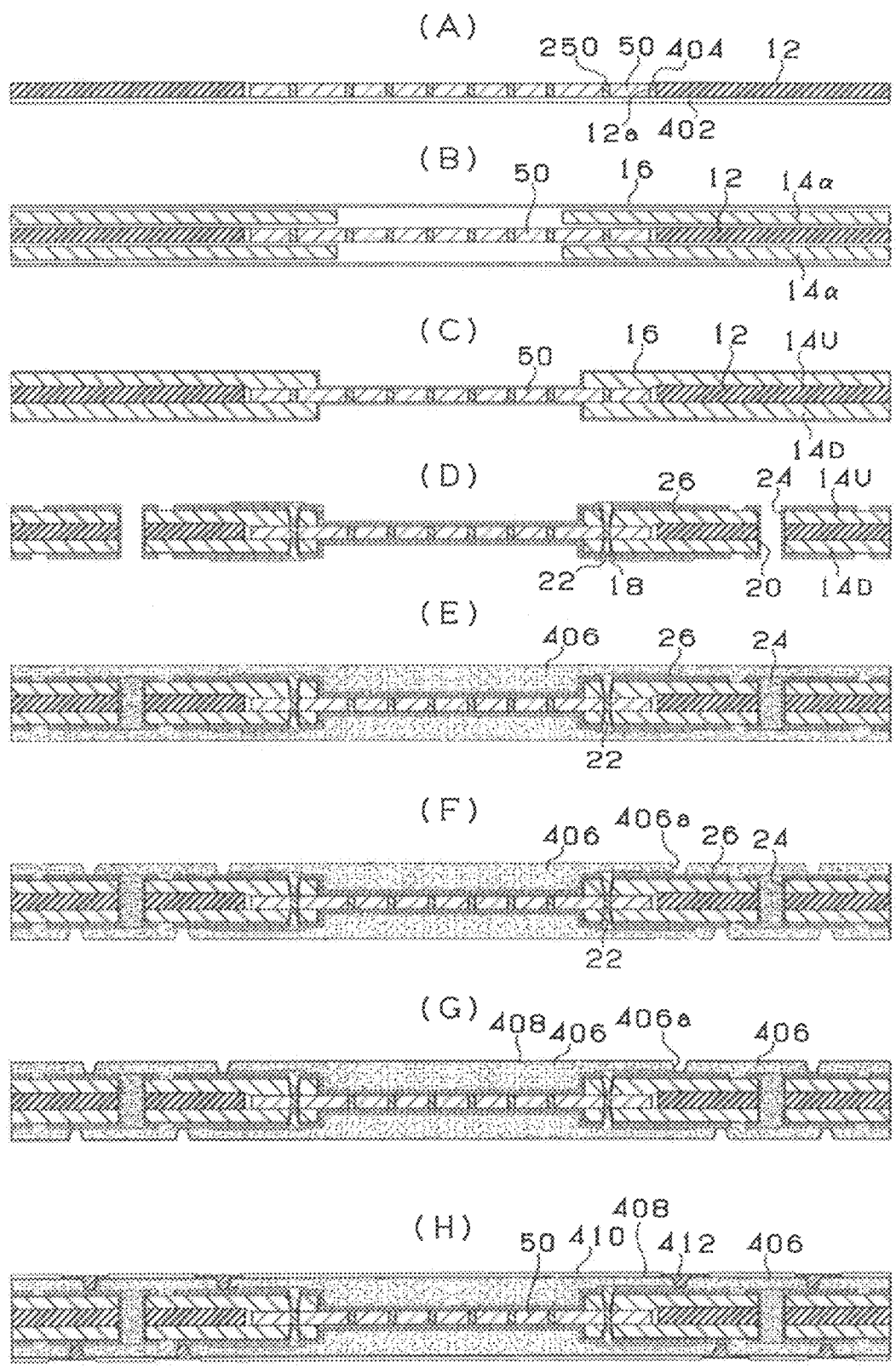
FIGS. 17(A)-17(H) are views showing the steps of a method for manufacturing a semiconductor-element mounting substrate according to the Fourth Embodiment of the present invention.
Figure 18:
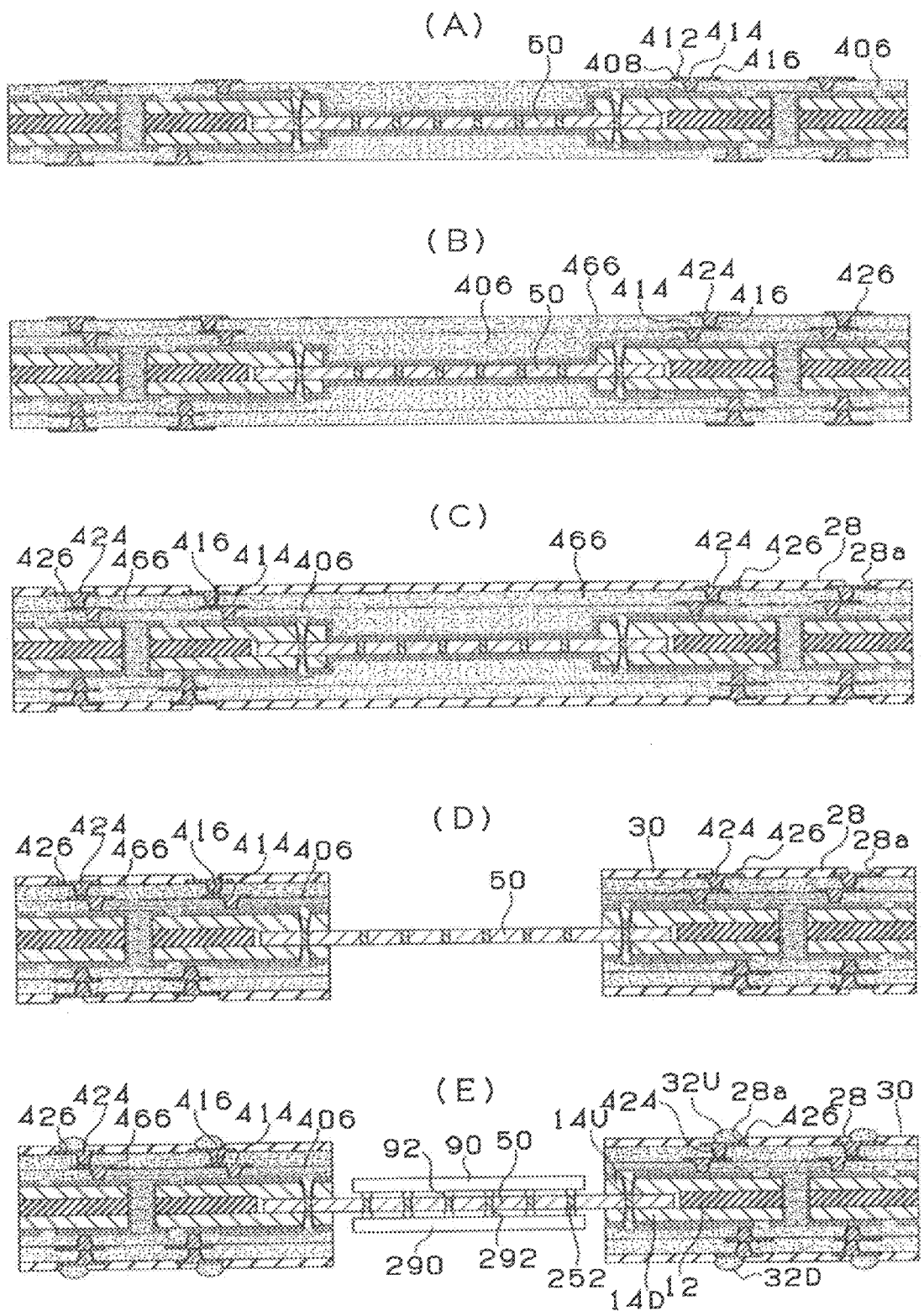
FIGS. 18(A)-18(E) are views showing the steps of a method for manufacturing a semiconductor-element mounting substrate according to the Fourth Embodiment.

The Fourth Embodiment is described with reference to FIGS. 17 and 18.

FIG. 18(A) is a cross-sectional view of semiconductor-element mounting substrate 10 according to the Fourth Embodiment. Semiconductor-element mounting substrate 10 is formed with low-thermal-expansion substrate 50 having a low CTE to mount IC chip 90 and organic substrate 30 to support low-thermal-expansion substrate 50 in an opening.

In the First through Third Embodiments, organic substrate 30 has upper interlayer resin layer (14U) and lower interlayer resin layer (14D) on the upper and lower sides of core substrate 12. By contrast, in the Fourth Embodiment, interlayer resin insulation layers 406 having via holes 414 and conductive circuits 416, and interlayer resin insulation layers 466 having via holes 424 and conductive circuits 426 are built up as upper layers of upper interlayer resin layer (14U) and lower interlayer resin layer (14D).

In the following, steps of manufacturing semiconductor-element mounting substrate 10 are described according to the Fourth Embodiment. First, low-thermal-expansion substrate 50 is accommodated in opening (12a) of core substrate 12 mounted on PET film 402, and resin 404 is filled in the gaps between opening (12a) and low-thermal-expansion substrate 50 so that low-thermal-expansion substrate 50 is fixed to core substrate 12 (FIG. 17(A)).

On the upper and lower sides of core substrate 12 after the PET film is removed, low-flow prepreg (14α, 14α) with openings (14a), which are smaller than the external shape of low-thermal-expansion substrate 50, are arranged. Then, on the outer surfaces of prepreg (14α, 14α), metal foil 16 such as copper foil is arranged (FIG. 17(B)). Here, core substrate 12 is made by laminating multiple sheets of prepreg with a core material such as glass cloth impregnated with resin such as epoxy resin or bismaleimide triazine (BT) resin, then by curing the prepreg. Prepreg (14α) is made by impregnating core material such as glass cloth with resin such as epoxy or bismaleimide triazine (BT) resin.

Next, core substrate 12, prepreg (14α 14α) and metal foil 16 are pressed and integrated (FIG. 17(C)). At that time, it is also preferred to cure prepreg (14α, 14α) by adding heat to make the prepreg upper interlayer resin layer (14U) and lower interlayer resin layer (14D).

Via openings 18 are formed using a laser in interlayer resin layers (14U, 14D), while through-hole openings 20 are formed by a laser or drill to penetrate upper interlayer resin layer (14U), core substrate 12 and lower interlayer resin layer (14D). Then, plated-metal film is formed by performing electroless copper plating and electrolytic copper plating. Accordingly, via conductors 22 are formed in via openings 18, and through-hole conductors 24 are formed in through-hole openings 20 (FIG. 17(D)).

After filler is filled in through-hole conductors 24, resin film for interlayer resin insulation layers (brand name: ABF-45SH, made by Ajinomoto Fine-Techno Co., Inc.) which is a little larger than the substrate, is placed on the substrate, preliminarily pressurized under predetermined conditions, then cut to size. Then, the film is laminated using vacuum laminator equipment under the following conditions, and interlayer resin insulation layers 406 are formed (FIG. 17(E)).

Next, using a CO2 gas laser with wavelength of 10.4 μm under predetermined conditions, via hole openings (406a) are formed in interlayer resin insulation layers 406 (FIG. 17(C)).

Next, the surfaces of interlayer resin insulation layers 406 including the inner walls of via-hole openings (406a) are roughened (not shown in the drawings). Here, such a roughening treatment is not always required.

Then, after the above treatment, the substrate is immersed in a neutralizer (Shipley Company LLC) and washed with water. In addition, palladium catalyst is applied on the roughened surfaces of the substrate, and catalytic nuclei are adhered to the surfaces of the interlayer resin insulation layers and the inner walls of via-hole openings.

Next, the substrate with adhered catalyst is immersed in an electroless copper plating solution to form electroless copper-plated film with a thickness of 0.3-3.0 μm on the entire roughened surfaces. Accordingly, a substrate is obtained in which electroless copper-plated films 408 are formed on the surfaces of interlayer resin insulation layers 406 including the inner walls of via-hole openings 51 (FIG. 17(G)).

Commercially available photosensitive dry film is laminated on the substrate having electroless copper-plated films 408, and the dry film is exposed to light and developed. Accordingly, plating resists 408 are formed. Then, the substrate is washed with 50° C. water to degrease it, washed with 25° C. water, and further cleansed with sulfuric acid. Then, electrolytic plating is performed to form electrolytic copper-plated films 412 with an approximate thickness of 15 μm in areas where plating resist 408 is not formed (FIG. 17(H)).

Furthermore, after plating resists 410 are removed by a 5% KOH solution, the electroless plating film under the plating resists is dissolved and removed by etching using a mixed solution of sulfuric acid and hydrogen peroxide. Accordingly, independent conductive circuits 416 and via holes 416 are formed (FIG. 18(A)).

By repeating the above procedure, further upper-layer interlayer insulation layers 466 with conductive circuits 426 and via holes 424 are formed. Accordingly, a semiconductor-element mounting substrate is obtained (FIG. 18(B)).

Next, on both surfaces of the semiconductor-element mounting substrate, a commercially available solder-resist composition is applied to a required thickness, dried, then exposed to light and developed. Accordingly, openings (28a) are formed (FIG. 18(C)). Then, heating treatment is further conducted to cure the solder-resist layers, and solder-resist layers with openings are obtained.

(19) Next, on the conductive circuits exposed through the openings of the solder-resist layers, a nickel-plated layer (not shown in the drawings) and a gold-plated layer are formed (not shown in the drawings). Other than forming nickel-gold layers, a single layer of tin, or of noble metal (gold, silver, palladium, platinum or the like) may also be formed.

Then, the metal foil, plated-metal film, interlayer resin insulation layers 406, interlayer resin insulation layers 466 and solder-resist layers 28 are removed from low-thermal-expansion substrate 50 (FIG. 18(D)).

Then, solder bumps (32U, 32D) are formed in openings (28a) of solder-resist layers 28, and IC chips (90, 290) are mounted on both surfaces of low-thermal-expansion substrate 50 (FIG. 18(E)).

In semiconductor-element mounting substrate 10 of the Fourth Embodiment, built-up layers are formed by alternately laminating interlayer resin insulation layers (406, 466) and conductive layers (416, 426) on interlayer resin layers (12U, 14U). Thus; fine-pitch wiring distribution may be achieved.

Fifth Embodiment

The Fifth Embodiment is described with reference to FIGS. 19-22.

FIG. 20(C) shows a cross-sectional view of semiconductor-element mounting substrates (10U, 10D) of the Fifth Embodiment. In the Fifth Embodiment, semiconductor-element mounting substrate (10D) and semiconductor-element mounting substrate (10U) for POP are connected by flexible wiring 500. As shown in FIG. 22, upper-side semiconductor-element mounting substrate (10U) is arranged on lower-side semiconductor-element mounting substrate (10D). IC chip 90 is mounted on low-thermal-expansion substrate 50 of lower-side semiconductor-element mounting substrate (10D); and IC chip 190 is mounted on upper-side semiconductor-element mounting substrate (10U). Upper-side semiconductor-element mounting substrate (10U) is fixed to lower-side semiconductor-element mounting substrate (10D) by means of adhesive layer 590.

Figure 20:
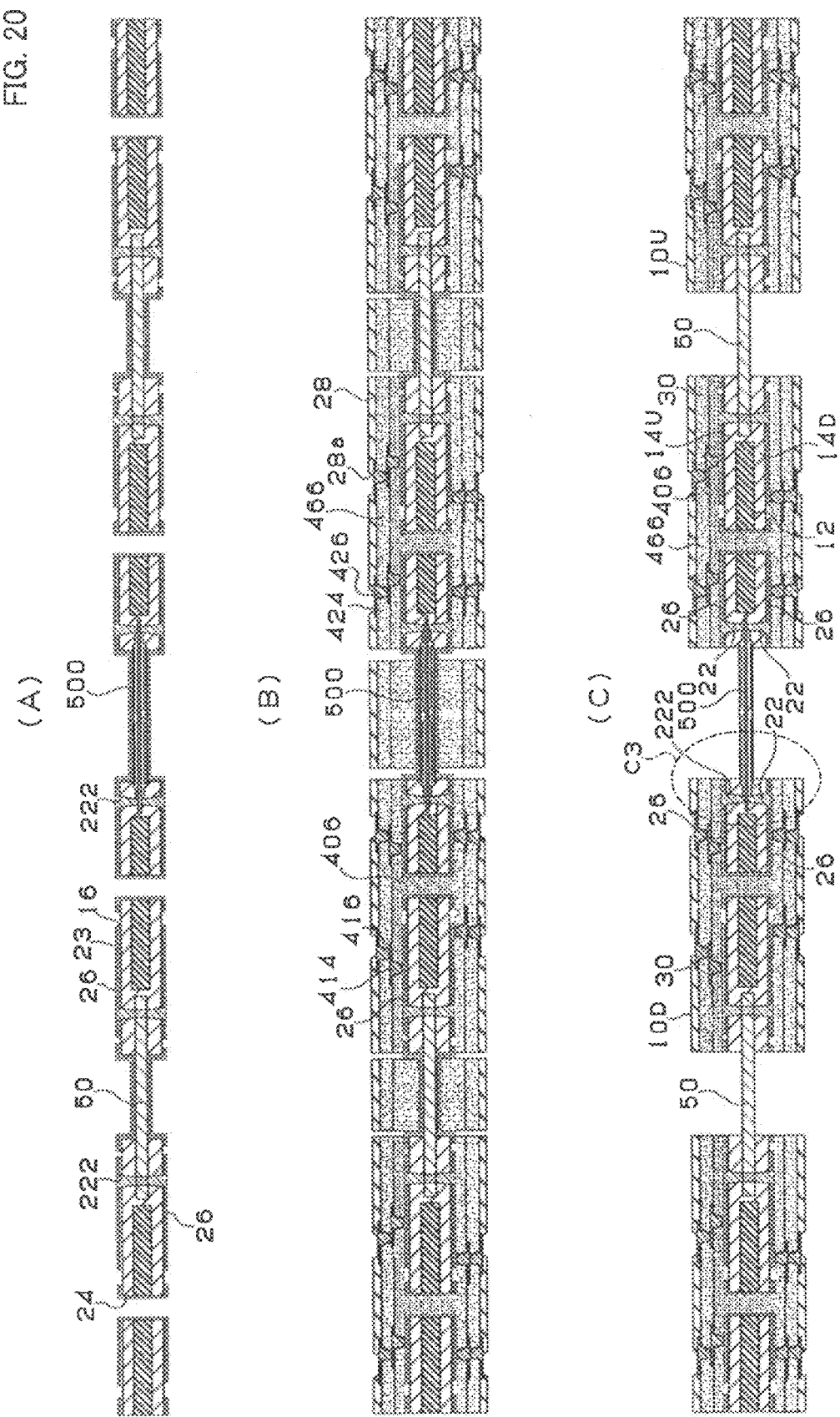
FIGS. 20(A)-20(C) are views showing the steps of a method for manufacturing a low-thermal-expansion substrate according to the Fifth Embodiment.
Figure 21:
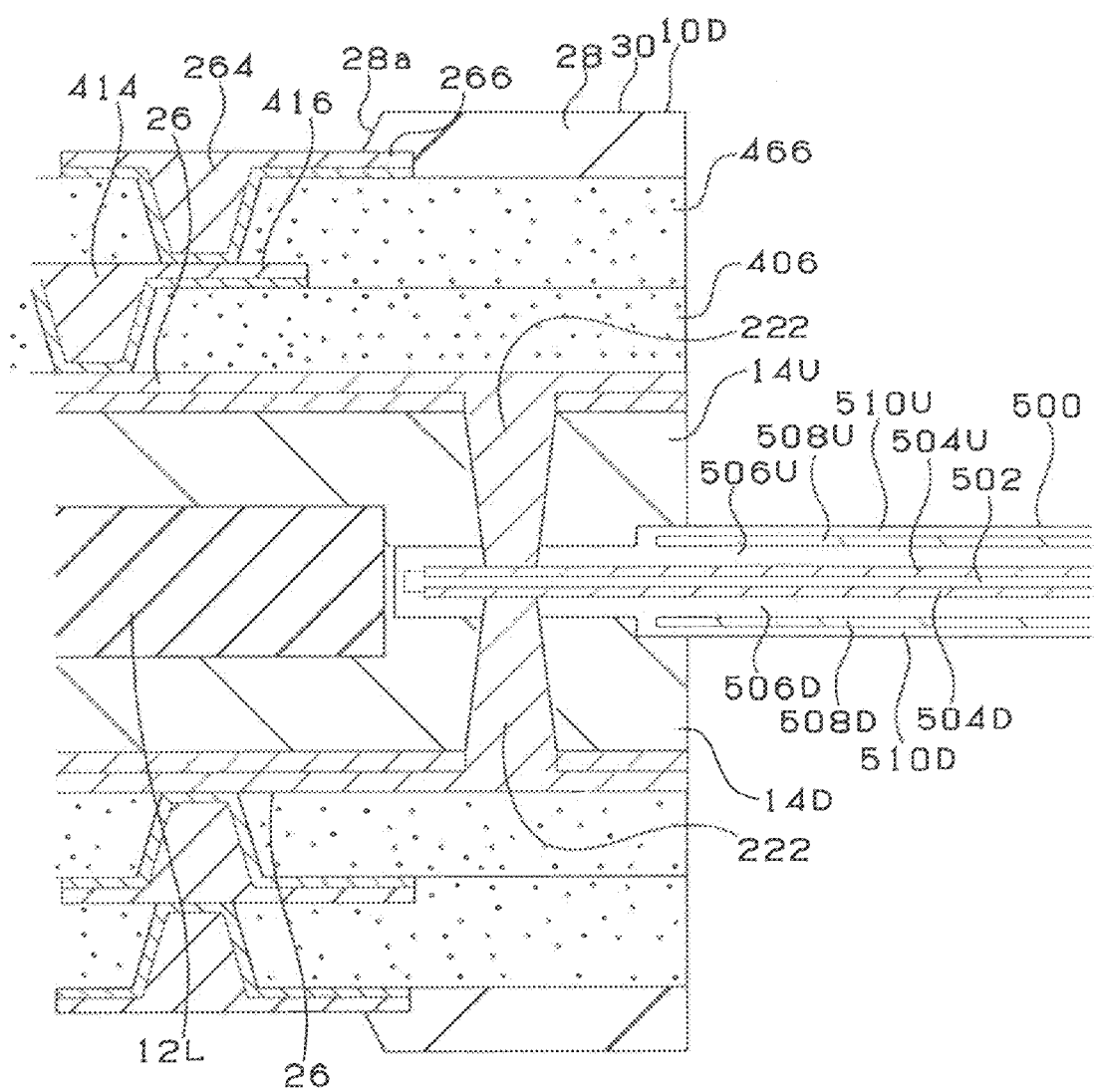
FIG. 21 is a magnified cross-sectional view showing the portion surrounded by circle (C3) in FIG. 20(C)

FIG. 21 is a magnified cross-sectional view of the portion surrounded by circle (C3) in FIG. 20(C). Flexible wiring 500 is formed by laminating base material 502, conductive layers (504D, 504U), insulation layers (506d, 506U), shielding layers (508D, 508U) and coverlays (510D, 510U).

Base material 502 is formed with an insulative flexible sheet, for example, a polyimide sheet with a thickness of 20-50 μm, preferably approximately 30 μm.

Conductive layers (504D, 504U) are formed respectively on the upper and lower surfaces of base material 502 and make striped wiring patterns. Conductive layers (504D, 504U) are made with, for example, copper patterns with an approximate thickness of 5-15 μm.

Insulation layers (506D, 506U) are made with polyimide film with an approximate thickness of 5-15 μm and insulate conductive layers (504D, 504U) from the outside.

Shielding layers (508D, 508U) are made with conductive layers, for example, cured silver-paste film, and they shield conductive layers (504D, 504U) from the outside electromagnetic noise as well as shield the electromagnetic noise from conductive layers (504D, 504U) to the outside.

Coverlays (510D, 510U) are made with insulative film such as polyimide with an approximate thickness of 5-15 μm, and insulate and protect the entire flexible substrate 500 from the outside. Flexible wiring 500 may be manufactured by a manufacturing method disclosed in Japanese Patent No. 4021472. The contents of this publication are incorporated herein by reference in their entirety.

Upper-side conductive circuits 26 of organic substrate 30 in semiconductor-element mounting substrate (10D) are connected to one end of conductive layer (504U) of flexible wiring 500 by means of via conductors 22. The other end of conductive layer (504U) is connected to conductive circuits 26 by means of upper-side via conductors 22 of organic substrate 30 in semiconductor-element mounting substrate (10U) as shown in FIG. 20(C). In the same manner, lower-side conductive circuits 26 of organic substrate 30 in semiconductor-element mounting substrate (10D) are connected to one end of conductive layer (504D) of flexible wiring 500 by means of via conductors 22. The other end of conductive layer (504D) is connected to conductive circuits 26 by means of lower-side via conductors 22 of organic substrate 30 in semiconductor-element mounting substrate (10U) as shown in FIG. 20(C).

Figure 19:
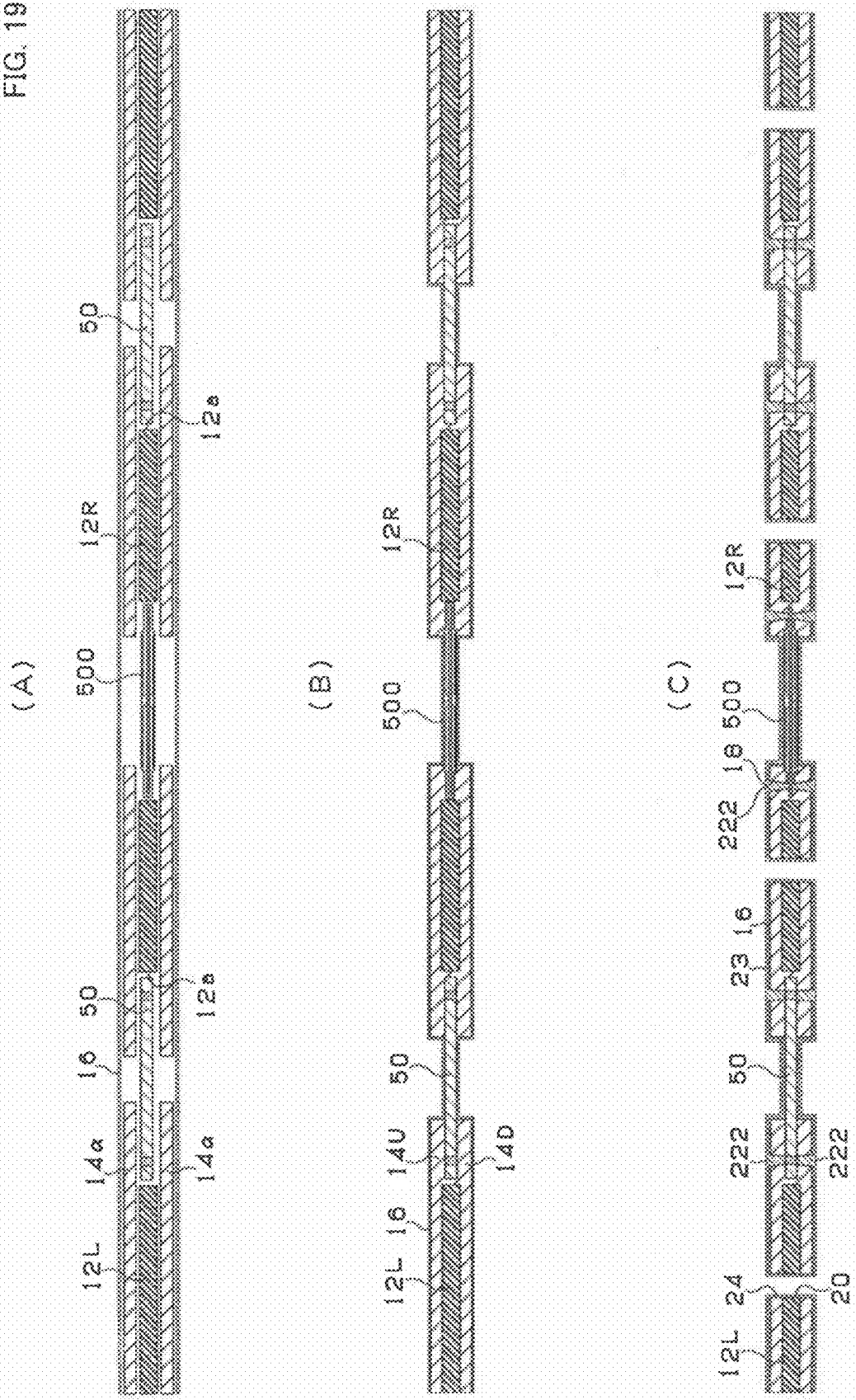
FIGS. 19(A)-19(C) are views showing the steps of a method for manufacturing a low-thermal-expansion substrate according to the Fifth Embodiment of the present invention.

In the following, a method for manufacturing a semiconductor-element mounting substrate according to the Fifth Embodiment is described with reference to FIGS. 19 and 20.

Low-thermal-expansion substrate 50 is arranged in opening (12a) of left-side core substrate (12L) as shown in FIG. 19(A); and low-thermal-expansion substrate 50 is arranged in opening (12a) of right-side core substrate (12R) as shown in the drawing. Furthermore, flexible wiring 500 is arranged between left-side core substrate (12L) and right-side core substrate (12R). Then, on the upper and lower sides of core substrates (12L, 12R), low-flow prepreg (14α, 14α) having openings (14a) smaller than the external shape of low-thermal-expansion substrate 50 is arranged. Furthermore, metal foil 16 made of copper foil or the like is arranged on the outer surfaces of prepreg (14α 14α). Here, core substrates (12L, 12R) are made by laminating multiple sheets of prepreg with a core material such as glass cloth impregnated with resin such as epoxy resin or bismaleimide triazine (BT) resin. Prepreg (14α) is made by impregnating core material such as glass cloth with resin such as epoxy resin or bismaleimide triazine (BT) resin.

Next, core substrates (12L, 12R), prepreg (14α, 14α) and metal foil 16 are pressed and integrated (FIG. 19(B)). At that time, it is also preferred to cure prepreg (14α, 14α) by adding heat to make the prepreg upper interlayer resin layer (14U) and lower interlayer resin layer (14D).

Using a laser or drill, openings are formed which penetrate interlayer resin layers (14U, 14D) and expose penetrating electrodes. In addition, through-hole openings 20 are formed which penetrate upper interlayer resin layer (14U), core substrate 12 and lower interlayer resin layer (14D). Then, electroless copper plating and electrolytic copper plating are performed in that order to form plated-metal film 23 on the surfaces of via openings 18, through-hole openings 20 and copper foil 16 (FIG. 19(C)). Then, plated-metal film 23 is patterned by etching to form conductive circuits 26 on upper interlayer resin layer (14U), conductive circuits 26 on lower interlayer resin layer (14D), via conductors 222 and through-hole conductors 24 (FIG. 20(A)).

As with the Fourth Embodiment described above with reference to FIGS. 17(E)-19(D), lower-layer interlayer resin insulation layers 406 with conductive circuits 416 and via holes 414 as well as upper-layer interlayer resin insulation layers 466 with conductive circuits 426 and via holes 424 are formed. Accordingly, a semiconductor-element mounting substrate is obtained (FIGS. 20(B), 20(C)).

Since flexible wiring 500 is arranged in organic substrate 30 for connection with semiconductor-element mounting substrate (10U) to be positioned on the upper side, semiconductor-element mounting substrate (10D) of the Fifth Embodiment may be connected to upper-side semiconductor-element mounting substrate (10U) by means of flexible wiring 500. As a result, solder bumps are not required to connect vertically arranged semiconductor-element mounting substrates, and connection reliability may be enhanced.

Obviously, numerous modifications and variations of the present invention are possible in light of the above teachings. It is therefore to be understood that within the scope of the appended claims, the invention may be practiced otherwise than as specifically described herein.

The invention claimed is:

1. A substrate for mounting a semiconductor element, comprising:
    a low-thermal-expansion substrate having a mounting region configured to mount a semiconductor element, the low-thermal-expansion substrate comprising:
        an inorganic insulating layer,
        a wiring layer provided in the inorganic insulating layer, and
        a plurality of mounting pads formed in the mounting region and electrically connected to said wiring layer, said plurality of mounting pads being configured to mount said semiconductor element;
    an organic substrate coupled to the low-thermal-expansion substrate, the organic substrate comprising:
        a core base material having an opening in which the low thermal expansion substrate is provided,
        an interlayer resin layer provided on the core base material and on a peripheral portion of the low thermal expansion substrate, said interlayer resin layer having a recess which exposes the mounting region of the low-thermal-expansion substrate and said plurality of mounting pads, and
    a conductive portion formed in the interlayer resin layer and extending to said peripheral portion of the low thermal expansion substrate, the conductive portion electrically connecting the wiring layer of the low-thermal-expansion substrate to a conductive circuit of the organic substrate.

2. The substrate for mounting a semiconductor element according to claim 1, wherein:
    the interlayer resin layer is made up of an upper interlayer resin layer and a lower interlayer resin layer which sandwich the peripheral portion of the low-thermal-expansion substrate, and
    the conductive circuit and the wiring layer are electrically connected by the conductive portion as a via conductor formed inside at least either the upper interlayer resin layer or the lower interlayer resin layer.

3. The substrate for mounting a semiconductor element according to claim 2, wherein the conductive circuit comprises a first conductive circuit formed on the upper interlayer resin layer and a second conductive circuit formed on the lower interlayer resin layer, said first and second conductive circuits being connected by a through-hole conductor which penetrates the upper interlayer resin layer, the core base material and the lower interlayer resin layer.

4. The substrate for mounting a semiconductor element according to claim 1, wherein a penetrating electrode is formed in the low-thermal-expansion substrate to make electrical continuity between an upper surface and a lower surface.

5. The substrate for mounting a semiconductor element according to claim 4, wherein penetrating electrodes are formed in a zigzag or grid array.

6. The substrate for mounting a semiconductor element according to claim 1, wherein built-up layers are formed on the interlayer resin layer by alternately laminating an interlayer resin insulation layer and a conductive layer.

7. The substrate for mounting a semiconductor element according to claim 1, wherein a thermal expansion coefficient of the low-thermal-expansion substrate is set in a range of 2.5-10 ppm.

8. The substrate for mounting a semiconductor element according to claim 1, wherein the inorganic insulating layer of low-thermal-expansion substrate is formed with silicon.

9. The substrate for mounting a semiconductor element according to claim 1, wherein a semiconductor element is accommodated in the first recessed section.

* * * * *